(12) United States Patent
Matsumoto et al.

(10) Patent No.: US 7,629,183 B2
(45) Date of Patent: Dec. 8, 2009

(54) METHOD FOR MANUFACTURING SEMICONDUCTOR DEVICE AND COMPUTER STORAGE MEDIUM

(75) Inventors: Kenji Matsumoto, Nirasaki (JP);
Masayuki Nasu, Nirasaki (JP);
Tomoyuki Sakoda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 11/815,868

(22) PCT Filed: Jun. 12, 2006

(86) PCT No.: PCT/JP2006/311764

§ 371 (c)(1),
(2), (4) Date: Aug. 9, 2007

(87) PCT Pub. No.: WO2006/134879

PCT Pub. Date: Dec. 21, 2006

(65) Prior Publication Data

US 2008/0248595 A1 Oct. 9, 2008

(30) Foreign Application Priority Data

Jun. 16, 2005 (JP) ............................. 2005-176060

(51) Int. Cl.
*H01L 21/00* (2006.01)
*H01L 21/44* (2006.01)
*H01L 21/8242* (2006.01)
*H01L 21/8246* (2006.01)
*H01L 29/76* (2006.01)
*H01L 29/94* (2006.01)
*H01L 31/113* (2006.01)
*H01L 31/119* (2006.01)
*H01L 31/062* (2006.01)

(52) U.S. Cl. ............................ 438/3; 438/681; 438/239; 438/254; 257/295; 257/E21.664; 257/E21.663; 257/E21.648

(58) Field of Classification Search ..................... 438/3, 438/681, 239, 254; 257/295, E21.664, E21.663, 257/E21.648
See application file for complete search history.

(56) References Cited

U.S. PATENT DOCUMENTS

| 6,054,331 | A  |   | 4/2000  | Woo et al.      |         |
|-----------|----|---|---------|-----------------|---------|
| 6,396,092 | B1 | * | 5/2002  | Takatani et al. | 257/295 |
| 6,461,737 | B2 | * | 10/2002 | Migita et al.   | 428/446 |
| 6,663,989 | B2 | * | 12/2003 | Lee et al.      | 428/702 |
| 6,777,248 | B1 | * | 8/2004  | Nabatame et al. | 438/3   |
| 6,800,889 | B2 | * | 10/2004 | Takatani et al. | 257/295 |

FOREIGN PATENT DOCUMENTS

JP    6 349324    12/1994

(Continued)

*Primary Examiner*—Luan C Thai
(74) *Attorney, Agent, or Firm*—Oblon, Spivak, McClelland, Maier & Neustadt, L.L.P.

(57) ABSTRACT

A method for fabricating a semiconductor device includes the steps of forming a PbTiOx film having a predominantly (111) orientation on a lower electrode as a nucleation layer by an MOCVD process with a film thickness exceeding 2 nm, and forming a PZT film having a predominantly (111) orientation on the nucleation layer, wherein the step of forming the PbTiOx film is conducted under an oxygen partial pressure of less than 340 Pa.

16 Claims, 36 Drawing Sheets

FOREIGN PATENT DOCUMENTS

| | | |
|---|---|---|
| JP | 2000 58526 | 2/2000 |
| JP | 2002 57156 | 2/2002 |
| JP | 2002 334875 | 11/2002 |
| JP | 2003 324101 | 11/2003 |
| JP | 2004 79675 | 3/2004 |
| JP | 2004 207628 | 7/2004 |
| JP | 2004 273470 | 9/2004 |
| JP | 2004 281762 | 10/2004 |
| KR | 1998-070383 | 10/1998 |

* cited by examiner

PT0:O$_2$= 500 SCCM
PZT:O$_2$= 2000 SCCM

PTO:O$_2$= 1000 SCCM

PZT:O$_2$= 2000 SCCM

PTO:O$_2$= 2000 SCCM
PZT:O$_2$= 2000 SCCM

FIG.21A
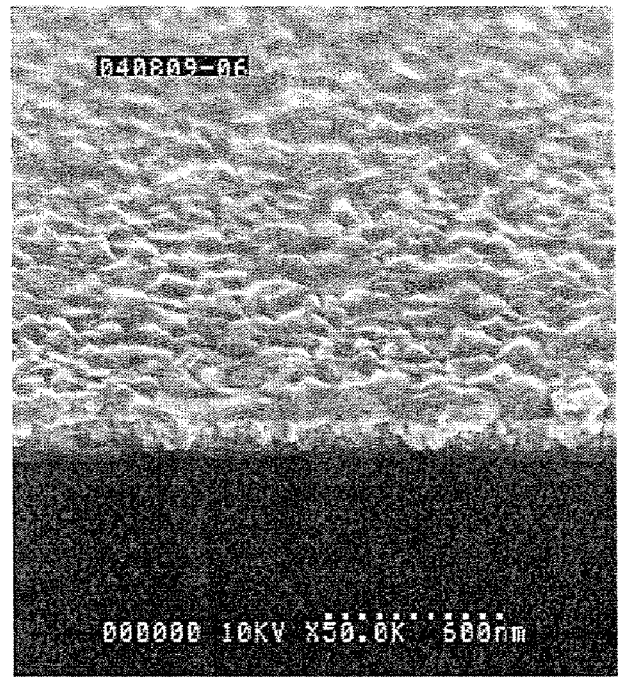
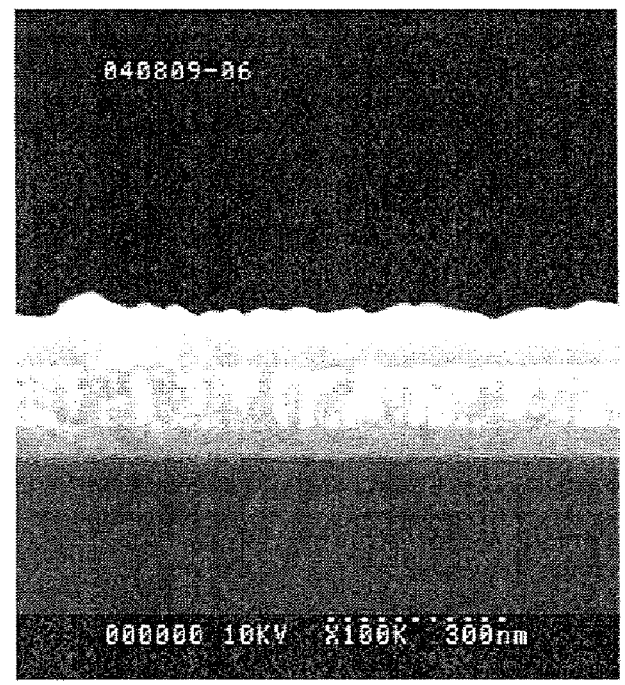
PT0 0nm

FIG.21B
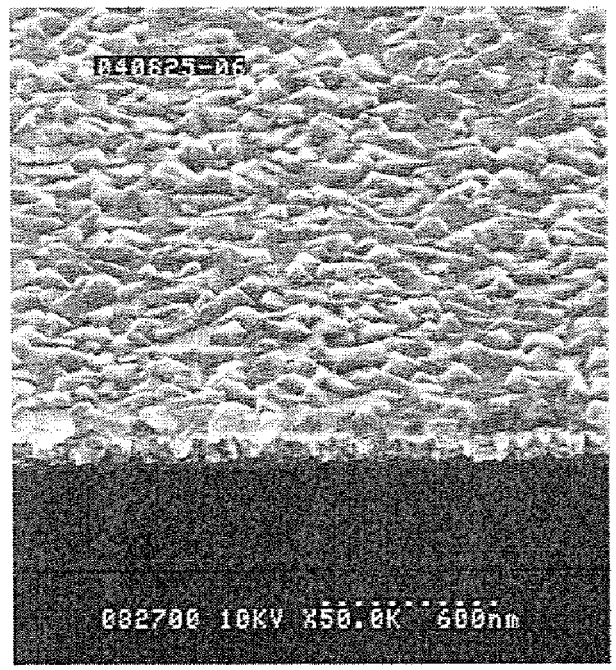
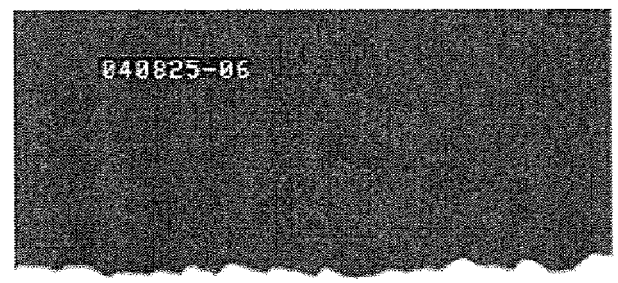
PT0 → PZT / Ir
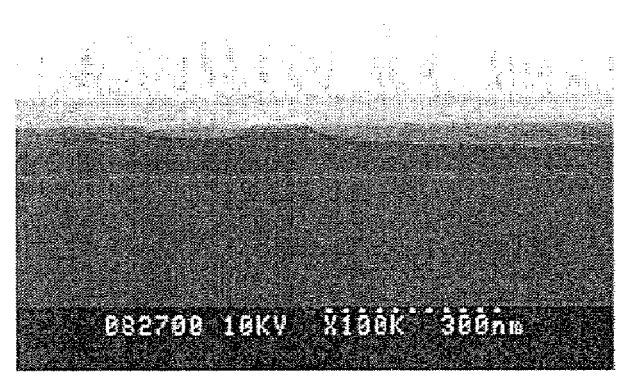
PT0 2nm

FIG.21C
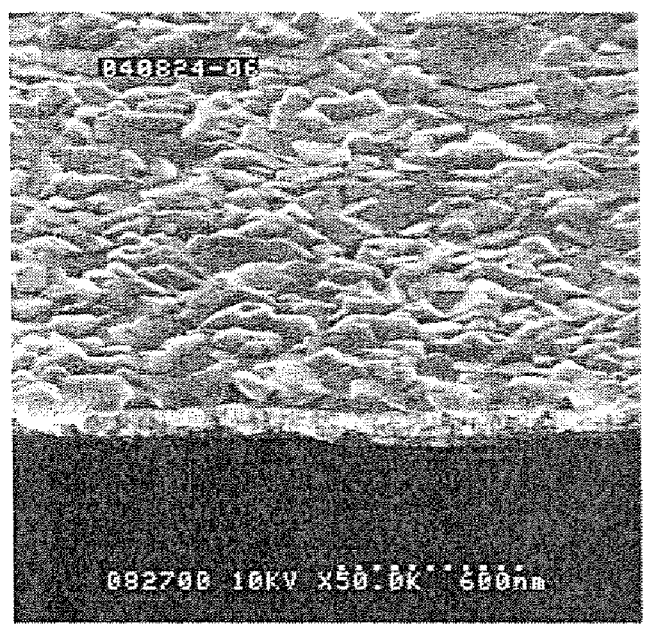
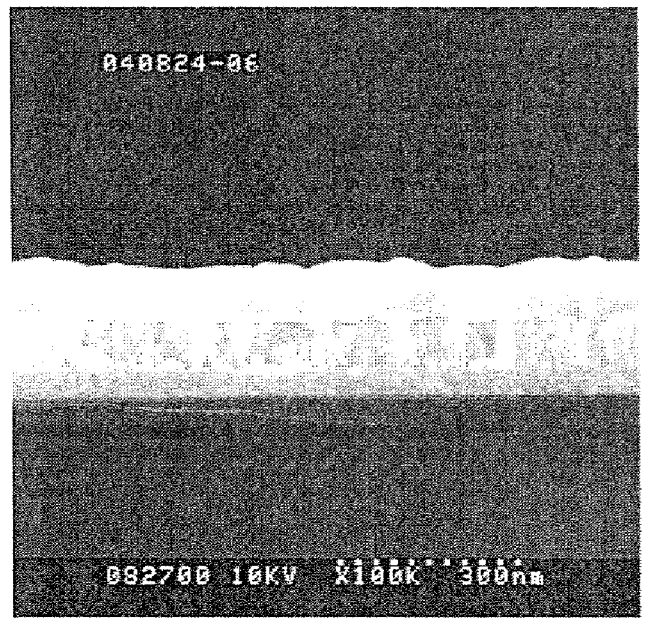
PT0 → PZT / Ir
PT0 5nm

FIG.21D
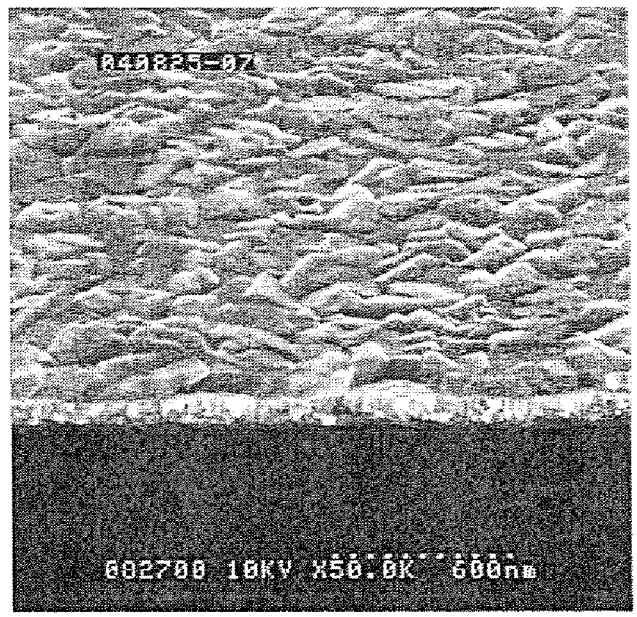
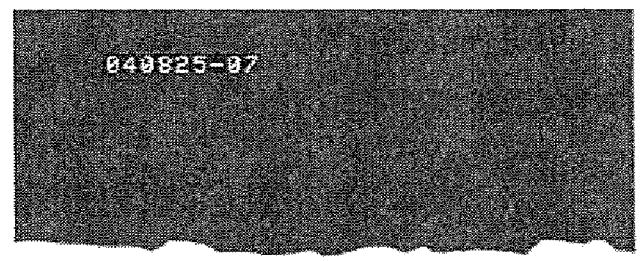
PT0  8nm

PTO:O₂ = 500 SCCM

PT0:O$_2$= 1000 SCCM

PT0:O$_2$= 2000 SCCM

Ptotal= 266.6 Pa

Ptotal= 533.3 Pa

Ptotal= 799.9 Pa

Ptotal= 1067 Pa

Pb = 0.24
Ti = 0.25
Zr = 0.00
BUTYL ACETATE = 0.71

Pb= 0.25
Ti= 0.25
Zr= 0.00
BUTYL ACETATE= 0.70

Pb= 0.27
Ti= 0.25
Zr= 0.00
BUTYL ACETATE= 0.68

METHOD FOR MANUFACTURING SEMICONDUCTOR DEVICE AND COMPUTER STORAGE MEDIUM

TECHNICAL FIELD

The present invention generally relates to fabrication of semiconductor devices and more particularly to fabrication of a semiconductor device having a ferroelectric film.

BACKGROUND ART

A ferroelectric memory is a high-speed non-volatile memory driven by voltage. A ferroelectric memory holds information in a ferroelectric capacitor in the form of spontaneous polarization and is used in various applications including memory cards. In such a ferroelectric memory, there is a need of the technology that enables formation of a metal oxide film of perovskite structure of typically PZT stably and with excellent controllability.

Patent Reference 1 Japanese Laid Open Patent Application 2003-324101
Patent Reference 2 Japanese Laid-Open Patent Application 2002-334875
Patent Reference 3 Japanese Laid-Open Patent Application 2002-57156
Patent Reference 4 Japanese Laid-Open Patent Application 6-349324
Patent Reference 5 Japanese Laid-Open Patent Application 2000-58526
Patent Reference 6 Japanese Laid-Open Patent Application 2004-273470
Patent Reference 7 Japanese Laid-Open Patent Application 2004-207628

DISCLOSURE OF THE INVENTION

FIG. 1 shows the construction of a ferroelectric memory 50 according to a related art of the present invention.

Referring to FIG. 1, the ferroelectric memory 50 is formed on a device region 1A defined on a silicon substrate 1 by a device isolation region 1B and includes a memory cell transistor, which in turn comprises a gate electrode 2 formed on the silicon substrate 1 via a gate insulation film 2 and diffusion regions 1a and 1b formed in the silicon substrate 1 at respective lateral sides of the gate electrode 3. Further, an interlayer insulation film 4 is formed on the silicon substrate 1 so as to cover the gate electrode 3 in the device region 1A.

On the interlayer insulation film 4, there is formed a hydrogen barrier film 5 of $Al_2O_3$, or the like, and a ferroelectric capacitor 6 of an Ir lower electrode film 6A, a PZT film 6B, and an Ir upper electrode film 6C, is formed on the hydrogen barrier film 5 in correspondence to the diffusion region 1a. The Ir lower electrode is connected to the diffusion region 1a via a conductive plug 4A such as W formed in the interlayer insulation film 4.

Further, the ferroelectric capacitor 6 is covered by an interlayer insulation film 7 formed on the hydrogen barrier film 5, wherein a plate line 8 is formed on the interlayer insulation film 7 so as to make a contact with the diffusion region 1b via a contact hole 4B that penetrates through the interlayer insulation film 7 and further through the interlayer insulation film 4.

So-called perovskite film such as PZT $(Pb(Zr,Ti)O_3)$ belongs to tetragonal crystal system. Therein, spontaneous polarization characterizing ferroelectricity is induced by a displacement of the Zr or Ti atoms in the crystal lattice in a c-axis direction. Thus, in the case of forming the capacitor insulation film 6B of the ferroelectric capacitor 6 used with the ferroelectric memory 50 of FIG. 1 by using such a perovskite film, it is ideal that the c-axes of the individual crystal grains that constitute the ferroelectric film are oriented parallel to a direction in which the electric field is applied, and thus in a direction perpendicular to the surface of the capacitor insulation film 6B (001) orientation). In the case the c axes are orientated in-plane to the capacitor insulation film 6B (100 orientation), on the other hand, desired spontaneous polarization is not induced even when a voltage is applied to the capacitor.

However, with a conventional PZT film of tetragonal crystal system, the difference between the c-axis direction and the a-axis direction is trifling, and thus, there appear crystal grains of (001) orientation and (100) orientation with generally the same number when a PZT film is formed by an ordinary process. In addition, there exist crystal grains formed with other orientations, and thus, the proportion of the crystals that actually contribute to the ferroelectric capacitor operation has been small.

In view of the foregoing circumstances, it has been practiced in the art of conventional ferroelectric memories to align the PZT crystal grains of the PZT film 6B, which constitutes the capacitor insulation film, in a <111> direction as a whole ((111) orientation), by controlling the composition an underlying film.

For example, Patent Reference 1 describes the technology of forming a PZT initial layer of predominantly (111) orientation at first, when forming a PZT film by an MOCVD process, under low oxygen concentration and then forms a PZT film of predominantly (111) orientation thereon as the capacitor insulation film.

The present invention provides a method for fabricating a semiconductor device having a PZT film of predominantly (111) orientation on a lower electrode, by interposing a PTO $(PbTiO_3)$ film capable of being formed at low temperatures between the lower electrode and the PZT film as an underlying film of the PZT film, and controlling the orientation of the PTO film in predominantly <111> direction ((111) orientation), such that the orientation direction of the PZT film can be controlled predominantly in the <111> direction.

Further, the present invention provides a method for fabricating a semiconductor device having a PZT film of predominantly (111) orientation on a lower electrode, by controlling a grain size of the PTO film such that it becomes possible to form a PZT film of planarized surface suitable for the formation of upper electrode, on the PTO film.

Further, the present invention provides a method for fabricating a semiconductor device having a PZT film of predominantly (111) orientation on a lower electrode, wherein the method enables formation of a PTO nucleation layer while suppressing abnormal growth of PbOx crystals at a surface thereof.

According to an aspect, the present invention provides a method for fabricating a semiconductor device, characterized by the steps of:

forming a PbTiOx film of predominantly (111) orientation on a lower electrode as a nucleation layer with a film thickness exceeding 2 nm by an MOCVD process; and forming a PZT film of predominantly (111) orientation on the nucleation layer, wherein said step of forming said PbTiOx film is conducted under an oxygen partial pressure of less than 340 Pa.

In another aspect, the present invention provides a computer storage medium recorded with software that causes, when executed, a general-purpose computer to control a deposition apparatus, said software causing said deposition apparatus to carry out a film forming method that forms a PZT film on a lower electrode layer, said film forming method comprising the steps of:

forming a PbTiOx film of predominantly (111) orientation on said lower electrode by an MOCVD process as a nucleation layer with a film thickness exceeding 2 nm; and forming a PZT films of predominantly (111) orientation on said nucleation layer, wherein said step of forming said PbTiOx film is conducted under an oxygen partial pressure of less than 340 Pa.

According to the present invention, it become possible to carry out the nucleation layer formation process at a low temperature of 450-550° C. by forming a PTO film on the lower electrode as a nucleation layer of the PZT film. As a result, it becomes possible to minimize the diffusion of impurity element in the active region at the time of thermal annealing process associated with formation of the ferroelectric film. Thereby, it should be noted that it becomes possible to form the PTO nucleation layer to have an (111) orientation as a whole by conducting the formation process of the nucleation layer with an oxygen partial pressure of less than 340 Pa, preferably 249 Pa or less, more preferably 163 Pa or less or with an oxygen flow rate of less than 2000 SCCM, preferably 1000 SCCM or less, more preferably 500 SCCM or less, and also forming the PTO nucleation layer with a film thickness exceeding 2 nm, 5 nm or more, preferably 8 nm or more. With this, the PZT film formed on the PTO nucleation layer has the same predominantly (111) orientation, and the PZT film shows excellent ferroelectricity in the case the electric field is applied in a direction perpendicular to the film surface. Further, it should be noted that the present invention is applicable also in the case of the film formation temperature of 550-600° C. or higher.

While the PZT film thus formed on the PTO nucleation layers of predominantly (111) orientation under such a low oxygen partial pressure shows the tendency of increased crystal grain size in the case the film thickness of the PTO film increased, the surface thereof remains flat, and a PZT film suitable for formation of the ferroelectric capacitor by forming an upper electrode is obtained.

Further, it is also possible to increase the degree of (111) orientation of the PTO nucleation layer by conducting the formation process of the nucleation layer under a total pressure of 1000 Pa or less.

Further, abnormal growth of the PbOx crystal on the PTO film is suppressed by suppressing a Pb/Ti ratio of Pb and Ti in the PTO film to be less than 1.09, preferably 1.05 or less, and formation of the PZT film is facilitated.

BRIEF DESCRIPTION OF THE DRAWINGS

FIGS. 21A-21D are diagrams showing a SEM photograph of the surface and cross-section of the PZT film formed with the first embodiment of the present invention;

BEST MODE FOR IMPLEMENTING THE INVENTION

First Embodiment

Figure 2:
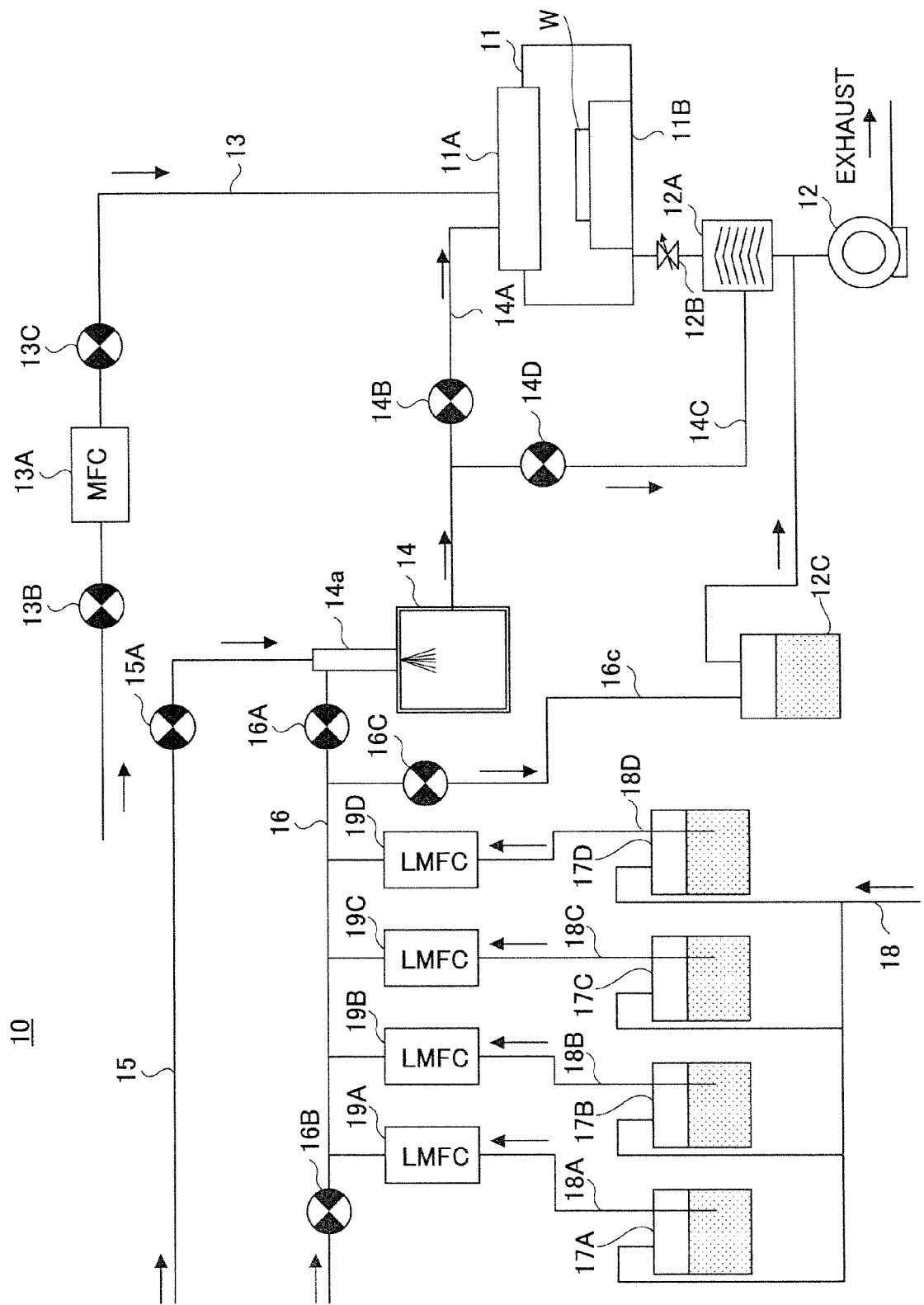
FIG. 2 is a diagram showing an MOCVD apparatus used with the present invention.

FIG. 2 shows the construction of a metal-organic CVD apparatus 10 used with the present invention.

Referring to FIG. 2, the metal-organic CVD apparatus 10 includes a processing vessel 11 provided with a shower head 11A, and a susceptor 11B holding a substrate to be processed W is provided inside the processing vessel 11. Further, the processing vessel 11 is evacuated by a vacuum pump 12 via a cooling trap 12A, wherein a drain tank 12C is evacuated also by the vacuum pump 12.

Further, an oxidation gas such as oxygen ($O_2$), ozone ($O_3$), $N_2O$, $NO_2$, or the like, is supplied to the processing vessel 11 from a line 13 via mass-flow controller 13A and valves 13B and 13C, and gaseous metal-organic source is supplied from a vaporizer 14 via lines 14A and 14B together with a carrier gas such as Ar, He, or the like. Further, the vaporizer 14 is connected to the cooling trap 12A via a line 14C and a valve 14D, and the gaseous metal-organic source formed in the vaporizer 14 is discarded to the trap 12A via the valve 14D and the line 14C in the case the gaseous metal-organic source is not supplied to the processing vessel 11.

The vaporizer 14 is provided with an atomizing nozzle 14a supplied with an inert gas such as He, Ar, nitrogen, or the like, from a line 15 via a valve 15A as an atomizing gas, wherein a line 16 constituting a manifold is connected to the atomizing nozzle 14a via valves 16A and 16B.

To the line 16, a tank 17A holding a solvent is connected via a line 18A and a liquid mass-flow controller 19A, and tanks 17B, 17C and 17D respectively holding liquid metal-organic sources of Pb, Zr and Ti are further connected thereto in parallel via respective lines 18B, 18C and 18D and respective liquid mass-flow controllers 19B, 19C and 19D.

Each of the tanks 17A-17D is supplied with a force feed gas such as an inert gas of He, Ar, or the like, or a nitrogen gas, from a line 18, and the liquid metal-organic sources of Pb, Zr and Ti are supplied to the atomizing nozzle 14a from the line 16 through valve 16A via respective lines 18A-18D and corresponding mass-flow controllers 19A-19D together with a solvent in the tank 17A.

In the present embodiment, $Pb(DPM)_2$, $Zr(O-i-Pr)(DPM)_3$, and $Ti(O-i-Pr)_2(DPM)_2$ are held respectively in the tanks 17B-17D in the form dissolved into butyl acetate as the liquid metal-organic sources of Pb, Zr and Ti. Further, the solvent tank 17A holds butyl acetate.

Thereby, an inert gas such as He, Ar, or the like, or a nitrogen gas is supplied to an end part of the line 16 from the valve 16B as a carrier gas, and the respective liquid sources in the line 16 are supplied to the atomizing nozzle 14a with certainty together with the solvent. The liquid sources are then converted to the gaseous metal-organic sources by the evaporation caused in the vaporizer 14.

While the gaseous metal-organic source thus formed in the vaporizer 14 is normally discarded to the cooling trap 12A through the valve 14D and a by-pass line 14C, it is introduced into the processing vessel 11 via the line 14A and the shower head 11A when the valve 14B is opened and the valve 14D is closed. Thereby, deposition of a ferroelectric film takes place on the substrate W to be processed.

Figure 3:
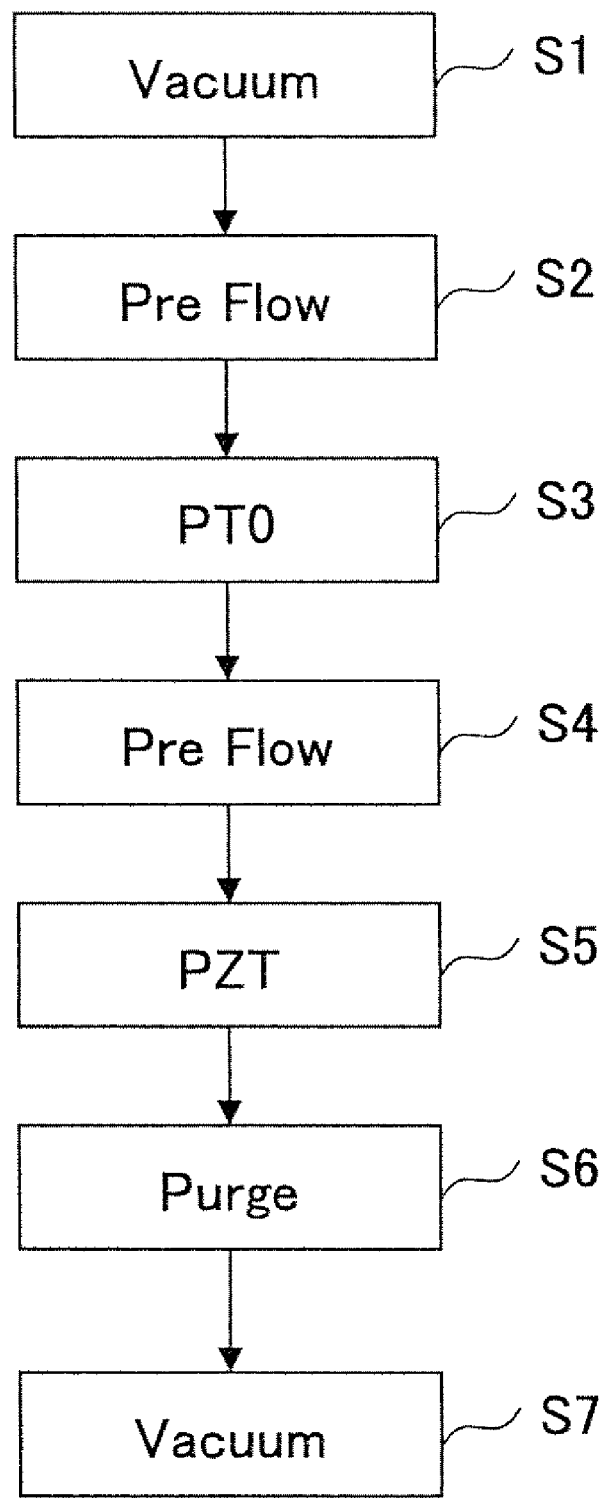
FIG. 3 is a flowchart showing the fabrication process of a semiconductor device according to a first embodiment of the present invention.
Figure 4:
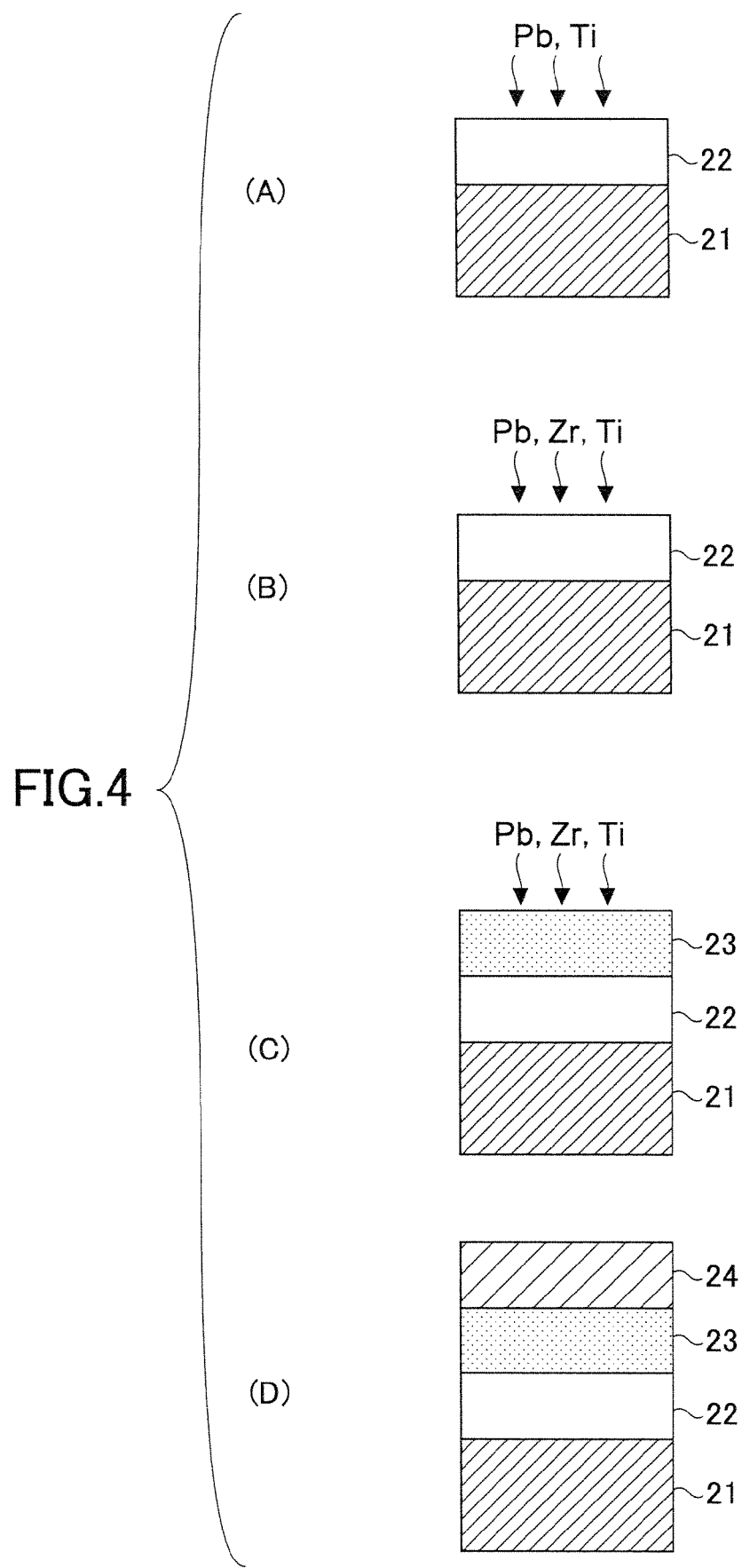
FIG. 4 is a diagram showing the fabrication process of a ferroelectric memory corresponding to the flowchart of FIG. 3.

FIG. 3 is a flowchart showing the operation of the metal-organic MOCVD apparatus 10 of FIG. 2, while the steps (A)-(D) of FIG. 4 shows an example of film formation of a PZT film conducted by the metal-organic MOCVD apparatus 10 of FIG. 2 in correspondence to the flowchart of FIG. 3.

Referring to FIG. 3, valves 13C and 14B are closed at first, and the processing vessel 11 is evacuated to vacuum state by the vacuum pump 12. In this state, a step 1 is conducted, and a silicon substrate formed with an Ir lower electrode is introduced into the processing vessel 11 and is held on the susceptor 11B as substrate W to be processed. In the step 1, the liquid mass-flow controllers 19B-19D are set to zero flow rate while the mass-flow controller 19A used to supply the solvent is set to a predetermined flow rate value, such as the flow rate value of 1.2 ml/minute, for example. Further, the substrate W to be processed is held on the susceptor 11B at the substrate temperature of 600° C. The Ir lower electrode is formed typically by a sputtering process.

Next, in a step 2, the liquid mass-flow controllers 19A, 19B and 19D are set to a predetermined flow rate value such that total flow rate to the vaporizer 14 becomes 1.2 ml/minute. With this, the solvent in the tank 17A and the metal-organic sources of Pb and Ti in the tanks 17B and 17D are supplied to the vaporizer 14 through the line 16 and gaseous sources of Pb and Ti are formed with evaporation of the metal-organic sources. Because the valve 14B is closed and the valve 14D is opened in the state of the step 2, the organic metal source gases of Pb and Ti thus formed are forwarded to the cooling trap 12A through the by-pass line 14C as it is (preflow). This is a procedure for supplying the gaseous sources of Pb and Ti to the processing vessel 11 with stable flow rate.

In this preflow process, on the other hand, it should be noted that the valves 13B and 13C of the oxidation gas are opened, and thus, the oxygen gas is supplied to the processing vessel 11 by the mass-flow controller 13A with a flow rate of 2000 SCCM, for example. Thereby, it should be noted that the interior of the processing vessel 11 is set to a predetermined process pressure of 533.3 Pa, for example, by controlling an APC (automatic pressure controller) 12B provided between the processing vessel 11 and the cooling trap 12A according to the inner pressure of the processing vessel 11.

Next, in a step 3, the valve 14B is opened and the valve 14D is closed. With this, the gaseous metal-organic sources of Pb and Ti formed in the vaporizer 14 are supplied to the shower head 11A through the valve 14B and are introduced into the processing vessel 11 from the shower head 11A together with an oxidation gas in the line 13. Here, it should be noted that the shower head 11A is a so-called post mix type shower head and the gaseous metal-organic sources of Pb and Ti and the oxidation gas are transported through the shower head 11A with separate paths.

With this, a PTO ($PbTiO_3$) film 22 is formed in the processing vessel 11 on the Ir lower electrode 21 formed on the silicon substrate (not shown) as a nucleation layer, as shown in the step (A) of FIG. 4.

Next the valve 14B is closed again in a step 4 of FIG. 3, and the gaseous metal-organic source formed with the vaporizer 14 is discarded to the cooling trap 12A through the by-pass line 14C by opening valve 14D (preflow).

With this step 4, the liquid mass-flow controller 19C that supplies the liquid metal-organic source of Zr is set to a predetermined flow rate value for the film formation of the PZT film during this interval, and the values of liquid mass-flow controllers 19B and 19D that supply the liquid metal-organic sources of Pb and Ti are set to predetermined flow rate values corresponding to the film formation of the PZT film. Thereby, the liquid mass-flow controller 19A is also set also to a predetermined flow rate value such that the total flow rate to the vaporizer 14 becomes 1.2 ml/minute, and the solvent in the tank 17A is supplied to the vaporizer 14 through the line 16.

As a result, there are formed, in the vaporizer 14, the gaseous metal-organic source of Pb, the gaseous metal-organic source of Zr, and further the gaseous metal-organic source of Ti, while these are discarded to the cooling trap 12A through the by-pass line 14C. With this, stable supply of the gaseous sources to the processing vessel 11 becomes possible at the start point of film formation.

Next, in a step 5, the valve 14B is opened and the valve 14D be closed. With this, the gaseous metal-organic source of Pb, the gaseous metal-organic source of Zr and also the gaseous metal-organic source of Ti formed in the vaporizer 14 are supplied to the shower head 11A, and with this, there occurs deposition of Pb, Zr an Ti on the PTO nucleation layer 22 on the Ir electrode 21 as shown in the step (B) of FIG. 4. Thus, in the step (C) of FIG. 4, a PZT film 23 is formed.

Further, by continuing the film formation process of the step 5, the PZT film 23 grows on the PTO nucleation layer 22.

After the process of the step 5, the flow rates of the liquid mass-flow controllers 19B-19D are set to the zero in a step 6, and supply of the metal-organic source to the processing vessel 11 is stopped.

With this, the setting of the liquid mass-flow controller 19A is changed also, and as a result, only the solvent is supplied to the vaporizer 14 with a flow rate of 1.2 ml/minute. Thereby, cleaning is made to the interior of the atomizing nozzle 14a of the vaporizer 14 or to the interior of the vaporizer 14. Thereby, it should be noted that, by closing the valve 14B and opening the valve 14D, the solvent evaporated in the vaporizer 14 circumvents the processing vessel 11 and is evacuated through the by-pass line 14C.

Further, in the step 6, the valves 13B and 13C are closed as soon as the flow rate of the mass-flow controller 13A is set zero, and the supply of the oxidation gas to the processing vessel 11 is stopped.

Further, in this state, the processing vessel 11 is purged by an inert gas of He, Ar, or the like, from a purge line (not shown) provided separately.

Further, in a step 7, the supply of the inert purge gas to the processing vessel 11 is stopped and the processing vessel 11 is evacuated to vacuum by fully opening the APC 12B.

Further, in a step (D) of FIG. 4, an electrode layer 24 of $IrO_2$, or the like, is formed on the PZT film 23 thus formed by a sputtering process.

Figure 1:
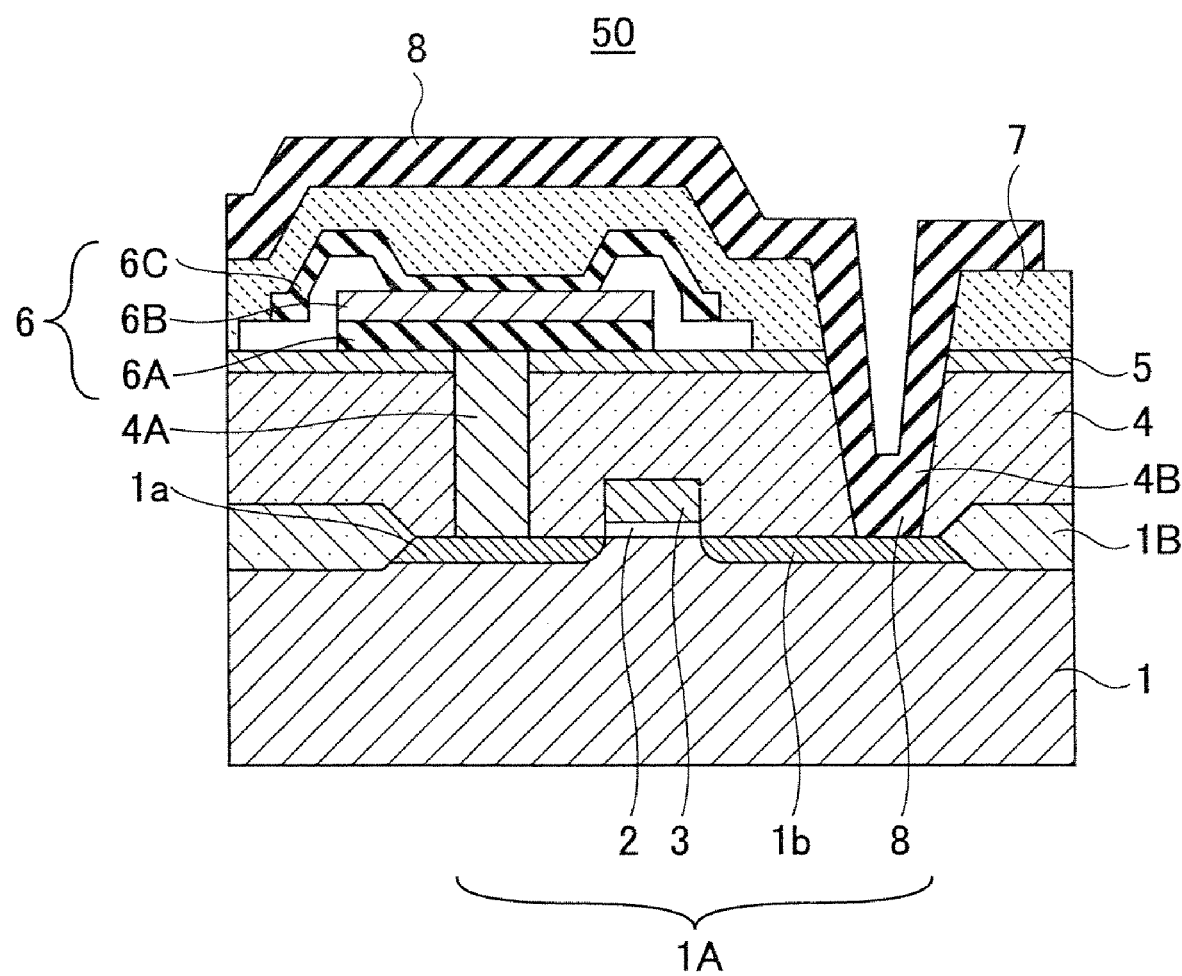
FIG. 1 is a diagram showing the construction of a ferroelectric memory device according to a related art of the present invention.

In the step (D) of FIG. 4, it should be noted that the Ir lower electrode 21 corresponds to the lower electrode 6A of FIG. 1 and lamination of the PTO film 22 and the PZT film 23 corresponds to the ferroelectric capacitor insulation film 6B of FIG. 1, and the $IrO_2$ upper electrode layer 24 corresponds to the upper electrode 6C of FIG. 1.

Figure 5:
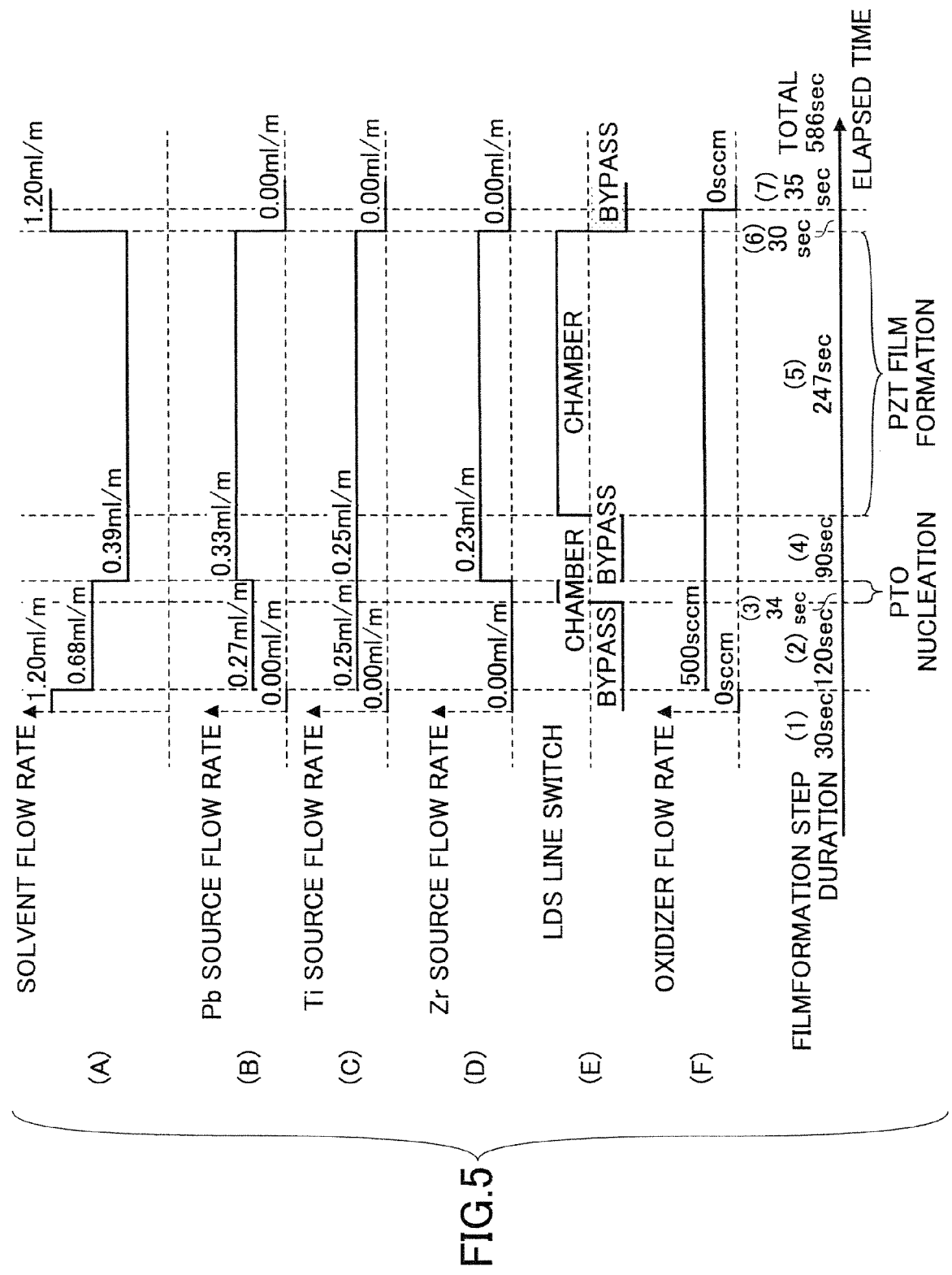
FIG. 5 is a diagram showing an apparatus recipe used with the first embodiment of the present invention.

(A)-(F) of FIG. 5 show an example of apparatus recipe used to control the MOCVD apparatus 10 of FIG. 2 in correspondence to the process flow of FIG. 3.

Referring to FIG. 5, (A) of FIG. 5 shows a flow rate change of the solvent of which flow rate is controlled by the liquid mass-flow controller 19A, while (B) of FIG. 5 shows a flow rate change of the Pb liquid metal-organic source of which flow rate is controlled by the liquid mass-flow controller 19B. Further, (C) of FIG. 5 shows a flow rate change of the Ti liquid metal-organic source of which flow rate is controlled by the liquid mass-flow controller 19D, while (D) of FIG. 5 shows the flow rate change of the Zr liquid metal-organic source of which flow rate is controlled by the liquid mass-flow controller 19C. Further, (E) of FIG. 5 shows the switching of the gaseous metal-organic source formed by the vaporizer 14 between the by-pass line 14C and the shower head 11A of the processing vessel 11 by way of switching of the valves 14B and 14D. Furthermore, (F) of FIG. 5 shows the flow rate of the oxidation gas introduced into the processing vessel 11 through the line 13.

In FIG. 5, it should further be noted that "(1)" of the horizontal axis corresponds to the vacuum evacuation process of the step 1 of FIG. 3, "(2)" corresponds to the preflow process of the step 2 of FIG. 3, "(3)" corresponds to the PTO nucleation layer formation process of the step 3 of FIG. 3, "(4)" corresponds to the preflow process of the step 4 of FIG. 3, "(5)" corresponds to the PZT film formation process of the step 5 of FIG. 3, "(6)" corresponds to the purging process of the step 6 of FIG. 3, and "(7)" corresponds to the vacuum evacuation process of the step 7 of FIG. 3.

Referring to (A) of FIG. 5, the solvent in the tank 17A is supplied to the vaporizer 14 during the vacuum evacuation process (1) by the liquid mass-flow controller 19A with the flow rate of 1.2 ml/minute, while when supply of the liquid metal-organic sources of Pb and Ti is started in the preflow process (2) with the respective flow rates of 0.27 ml/minute and 0.25 ml/minute as shown in (B) and (C) of FIG. 5 after the vacuum evacuation process for 30 seconds, the flow rate preset value of the liquid mass-flow controller 19A is decreased in (A) of FIG. 5 with the foregoing amount, and the solvent flow rate value is set to 0.68 ml/minute. At the same time to this, the valves 13B and 13C are opened, and the oxidation gas is supplied to the shower head 11A via the mass-flow controller 13A with the flow rate of 500 SCCM. It should be noted that the foregoing supply of the oxidizing agent is continued until the purging process (6) corresponding to the step 6 is over.

The preflow process (2) is continued for 120 seconds. During this interval, the gaseous metal-organic sources of Pb and Ti formed by the vaporizer 14 are discarded to the by-pass line 14C through the valve 14D, while the valves 14B and 14D are switched in the next process (3) of PTO nucleation layer formation, and the gaseous metal-organic sources of Pb and Ti are introduced from the vaporizer 14 into the processing vessel 11 via the shower head 11A with the timing shown in (E) of FIG. 5.

The nuclei formation process (3) is continued for 34 seconds in the illustrated example, and the PTO nucleation layer 22 is formed on the Ir electrode layer 21 with a film thickness of 8 nm, for example.

Thereafter, the valves 14B and 14D are switched again to the preflow state in the preflow process (4) corresponding to the step 4 of FIG. 3, and the gaseous source formed by the vaporizer 14 is discarded via the by-pass line 14C.

With this preflow process (4), the liquid metal-organic sources of Pb, Ti and Zr are supplied with respective flow rates 0.33 ml/minute, 0.25 ml/minute and 0.23 ml/minute to the vaporizer 14 by controlling the liquid mass-flow controllers 19B-19D. Also, the liquid mass-flow controller 19A is controlled in accordance with this, such that the flow rate of the solvent supplied to the vaporizer 14 is set to 0.39 ml/minute. With this, the total flow rate of the liquid source materials that are supplied to the vaporizer 14 is maintained at 1.2 ml/minute.

In the preflow process (4), the gaseous metal-organic sources of Pb, Ti and Zr are formed in vaporizer 14 as such, and when the formation thereof is stabilized, the film formation process (5) of the PZT film is started in correspondence to the step 5 of FIG. 3.

Thus, with start of the PZT film formation process (5), the valves 14B and 14D are switched, and the gaseous metal-organic source formed by the vaporizer 14 is supplied to the processing vessel 11 via the shower head 11A.

For example, the PZT film formation process (5) is continued for 247 seconds, and the desired PZT film 23 is grown on the PTO nucleation layer 22 in correspondence to the step (C) of the FIG. 4.

Thereafter, the valves 14B and 14D are again switched to the preflow state in the purging process (6) corresponding to the step 6 of FIG. 3. Further, by controlling the liquid mass-flow controllers 19B-19D in this state, supply of the liquid metal-organic sources of Pb, Zr and Ti to the vaporizer 14 is blocked.

Further, in accordance with this, the liquid mass-flow controller 19A is controlled and the solvent is supplied to the vaporizer 14 with the predetermined flow rate of 1.2 ml/minute.

After this idling state, the valves 13C and 14B are closed and the vacuum evacuation process (7) corresponding to the step 7 of FIG. 3 is conducted.

Unless noted specifically, it is assumed in the explanation below that the process of the steps 1-7 is conducted under the total pressure of 533.3 Pa at the substrate temperature of 600° C. by setting the total flow rate of the liquid source material including the solvent supplied to the vaporizer 14 to 1.2 ml/minute.

Figure 6:
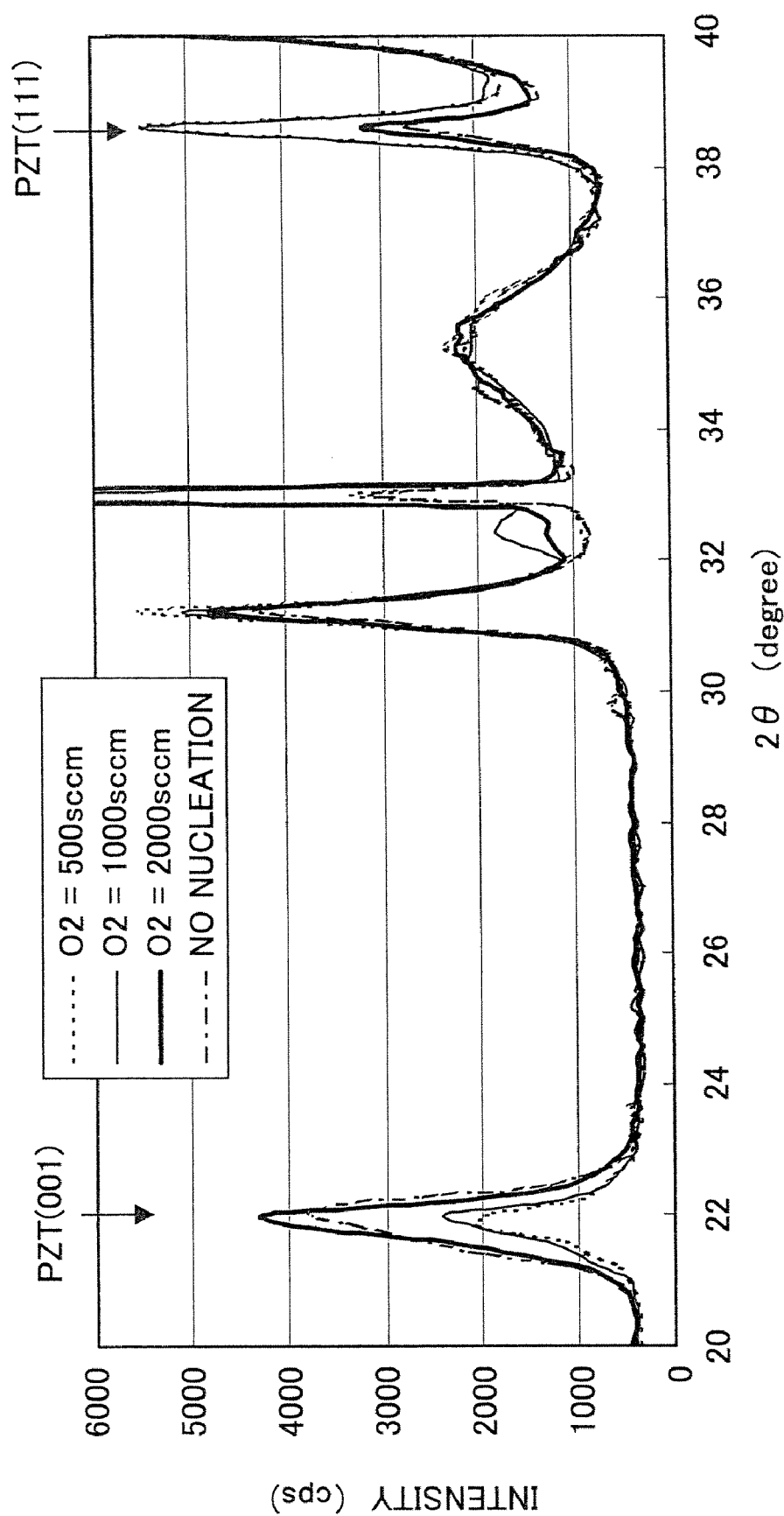
FIG. 6 is a diagram showing an X-ray diffraction pattern of the PZT film formed with the first embodiment of the present invention.

FIG. 6 shows an X-ray diffraction pattern of the PZT film 23 obtained on the PTO nucleation layer 22 in the case the flow rate of the oxygen gas supplied from the line 13 to the shower head 11A is changed to 500 SCCM, 1000 SCCM and to 2000 SCCM in the nucleation layer formation process (3) of the step 3, which forms the PTO nucleation layer 22. It should be noted that FIG. 6 also shows the case in which formation of the nucleation layer 22 is not conducted. Furthermore, in the experiment of FIG. 6, it should be noted that the thickness of the PTO nucleation layer 22 is set to 8 nm when forming the PTO nucleation layer 22.

Referring to FIG. 6, it can be seen that, in the case the PTO nucleation layer 22 is not formed or the oxygen flow rate at the time of forming the nucleation layer 22 is 2000 SCCM, the intensity of the (111) surface diffraction from the PZT film 23 thus obtained is low, while in the case the oxygen flow rate is set to 1000 SCCM or 500 SCCM, there occurs a remarkable increase in the intensity of diffraction from the (111) surface in the PZT film 23. It is understood that this change of crystal orientation of the PZT film 23 reflects the change of crystal orientation caused in the PTO nucleation layer 22 with change of the oxygen flow rate, and hence the oxygen partial pressure, at the time of formation of the PTO nucleation layer 22.

Figure 7:
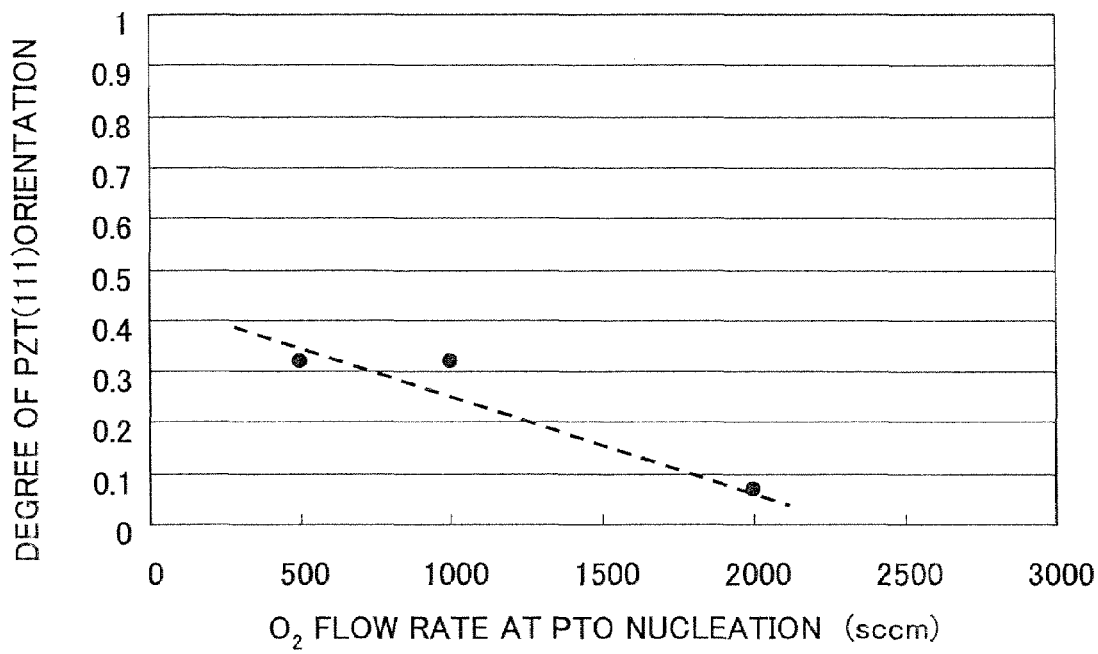
FIG. 7 is a diagram showing the relationship between oxygen flow rate at the time of formation of the PTO nucleation layer film and the orientation of the PZT film formed with the first embodiment of the present invention.

FIG. 7 shows the relationship between the oxygen flow rate at the time of formation of the PTO nucleation layer 22 and the degree of (111) surface orientation of the PZT film corresponding to FIG. 6. Here, it should be noted that the degree of (111) surface orientation of PZT is calculated based on the X-ray diffraction pattern of FIG. 6 according to equation (1):

$$\text{degree of (111) surface orientation of } PZT = PZT(111)/(PZT(100),(001) + PZT(110),(101) + PZT(111)). \quad (1)$$

Referring to FIG. 7, it can be seen that, in the region where the oxygen flow rate is less than 2000 SCCM at the time of formation of the PTO nucleation layer 22, the degree of (111) surface orientation of the PZT film 23 obtained thereon increases with decrease of the oxygen flow rate. For example, it can be seen that a degree of surface orientation of about 0.3 is attained for the PZT (111) surface when the oxygen flow rate is set to 1000 SCCM or 500 SCCM, while this is about 3 times as large as in the case of using the oxygen flow rate of 2000 SCCM.

Figure 8:
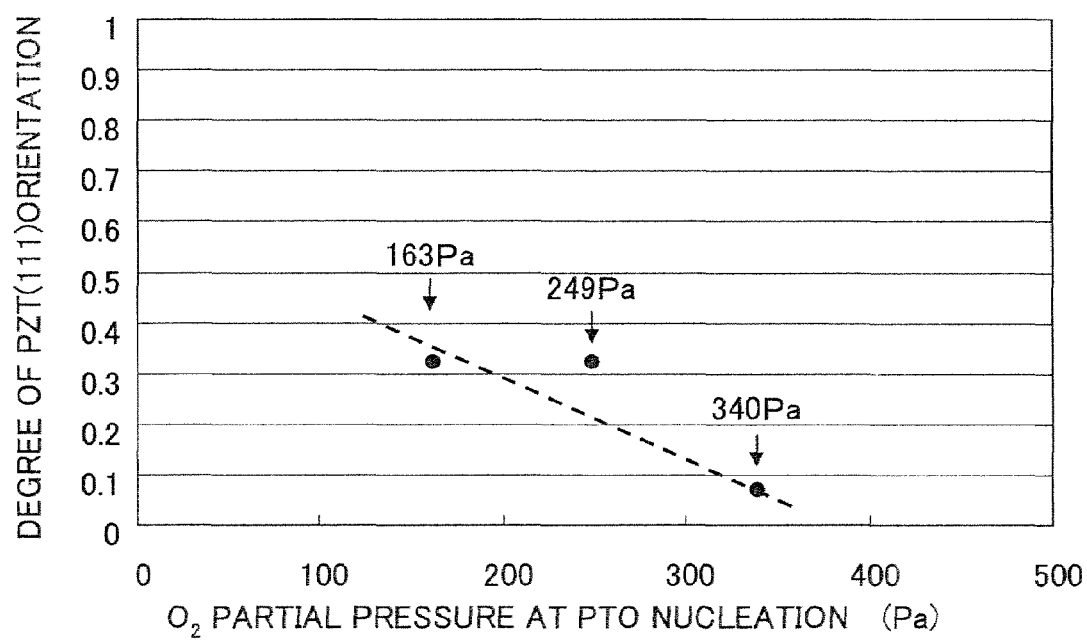
FIG. 8 is a diagram showing the relationship between the oxygen partial pressure at the time of formation of the PTO nucleation layer film and the orientation of the PZT film formed with the first embodiment of the present invention.

FIG. 8 is a diagram in which the same drawing as FIG. 7 is plotted by converting the horizontal axis to oxygen partial pressure.

Referring to FIG. 8, at the time of formation of the PTO nucleation layer 22, it can be seen that the degree of (111) surface orientation of the PZT film 23 increases with decrease of the oxygen partial pressure in the region of oxygen partial pressure of less than 340 Pa. For example, it can be seen that a degree of surface orientation of about 0.3 is attained for the PZT (111) surface when the oxygen partial pressure is set to 249 Pa or 163 Pa, while this is about 3 times as large as in the case of using the oxygen partial pressure of 340 Pa.

From FIGS. 7 and 8, it is preferable, in order to realize the desired (111) orientation of the PZT film 23, to form the PTO nucleation layer 22, which serves for the underlying layer of the PZT film 23 with the oxygen flow rate of less than 2000 SCCM or with the oxygen partial pressure of less than 340 Pa. Particularly, it is more desirable to form the PTO nucleation layer 22 with oxygen flow rate of 1000 SCCM or less or with oxygen partial pressure of 249 Pa or less. Further, by setting the oxygen flow rate to 500 SCCM or less or by setting the oxygen partial pressure to 163 Pa or less at the time of formation of the PTO nucleation layer 22, it is possible to increase the degree of (111) surface orientation of the PZT film further.

Figure 9:
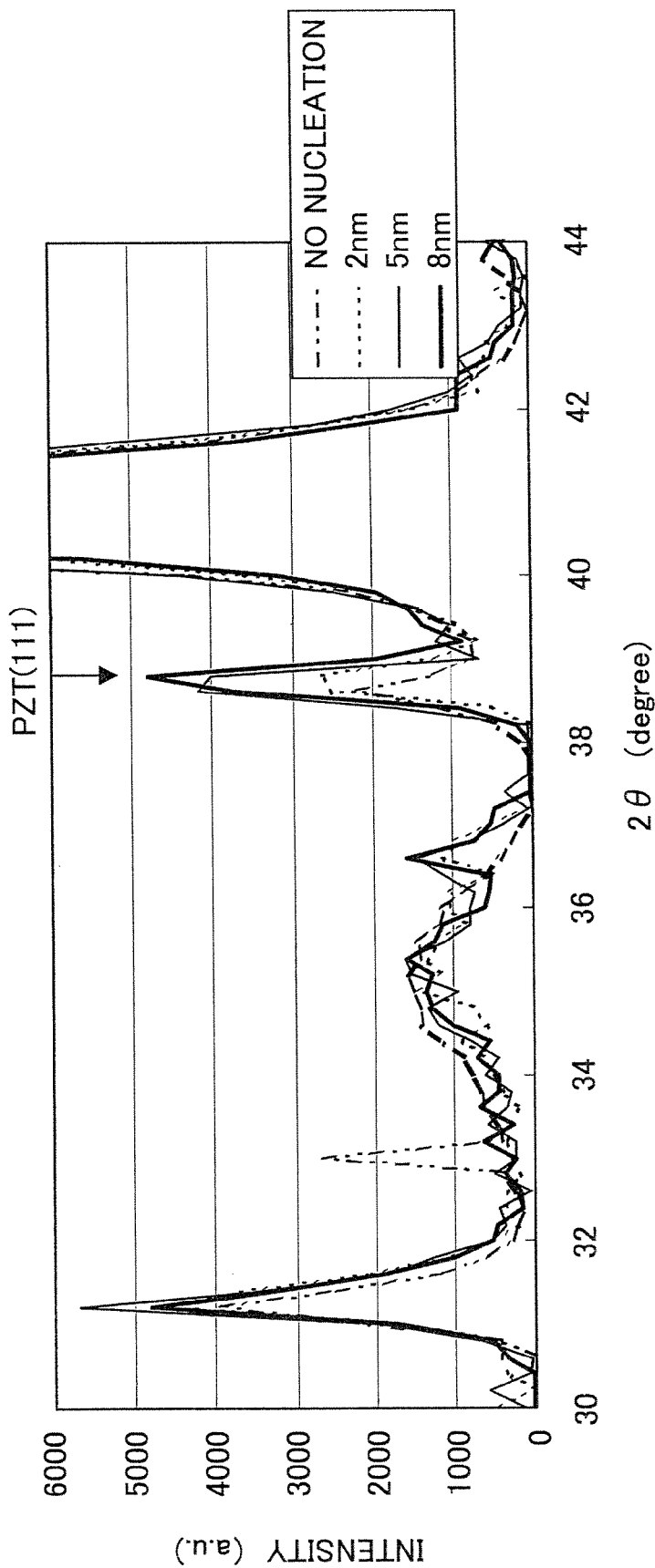
FIG. 9 is a diagram showing an X-ray diffraction pattern of the PZT film formed according to the first embodiment of the present invention.

FIG. 9 shows the X-ray diffraction pattern of the PZT film 23 formed on the PTO nucleation layer 22 for the case of changing the film thickness of the PTO nucleation layer 22 to 0 nm (no film formation), 2 nm, 5 nm and also 8 nm in the nucleation layer formation process (3) of the step 3, which forms the PTO nucleation layer 22. Further, FIG. 10 is a diagram showing the part of the X-ray diffraction pattern of FIG. 9 corresponding to the diffraction peak of the PZT (111) surface with enlarged scale, wherein it should be noted that the experiments of FIGS. 9 and 10 of forming the PTO nucleation layer 22 are conducted under the oxygen flow rate of 500 SCCM, and hence under the oxygen partial pressure of 163 Pa, in view of the knowledge of FIGS. 6-8 noted previously.

Figure 10:
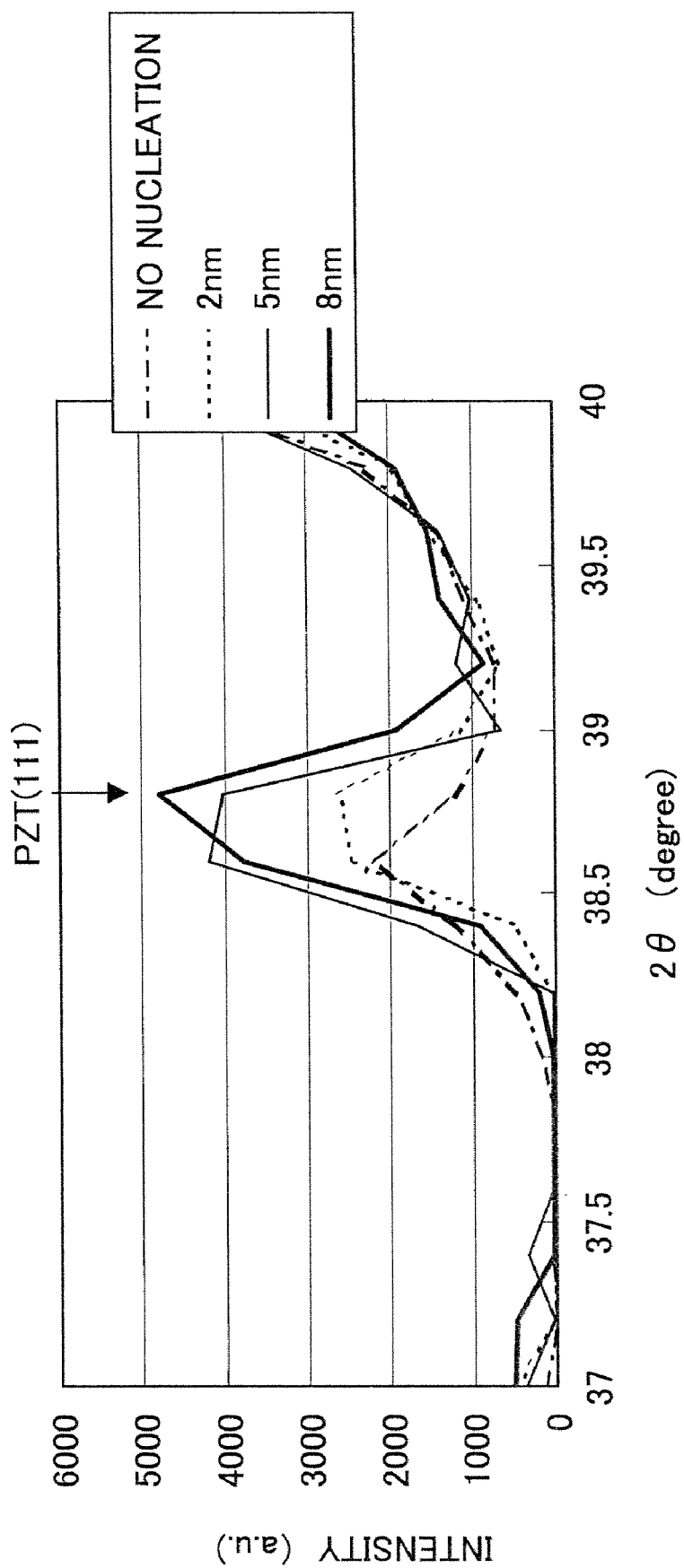
FIG. 10 is a diagram showing a part of FIG. 9 with enlarged scale.
Figure 11:
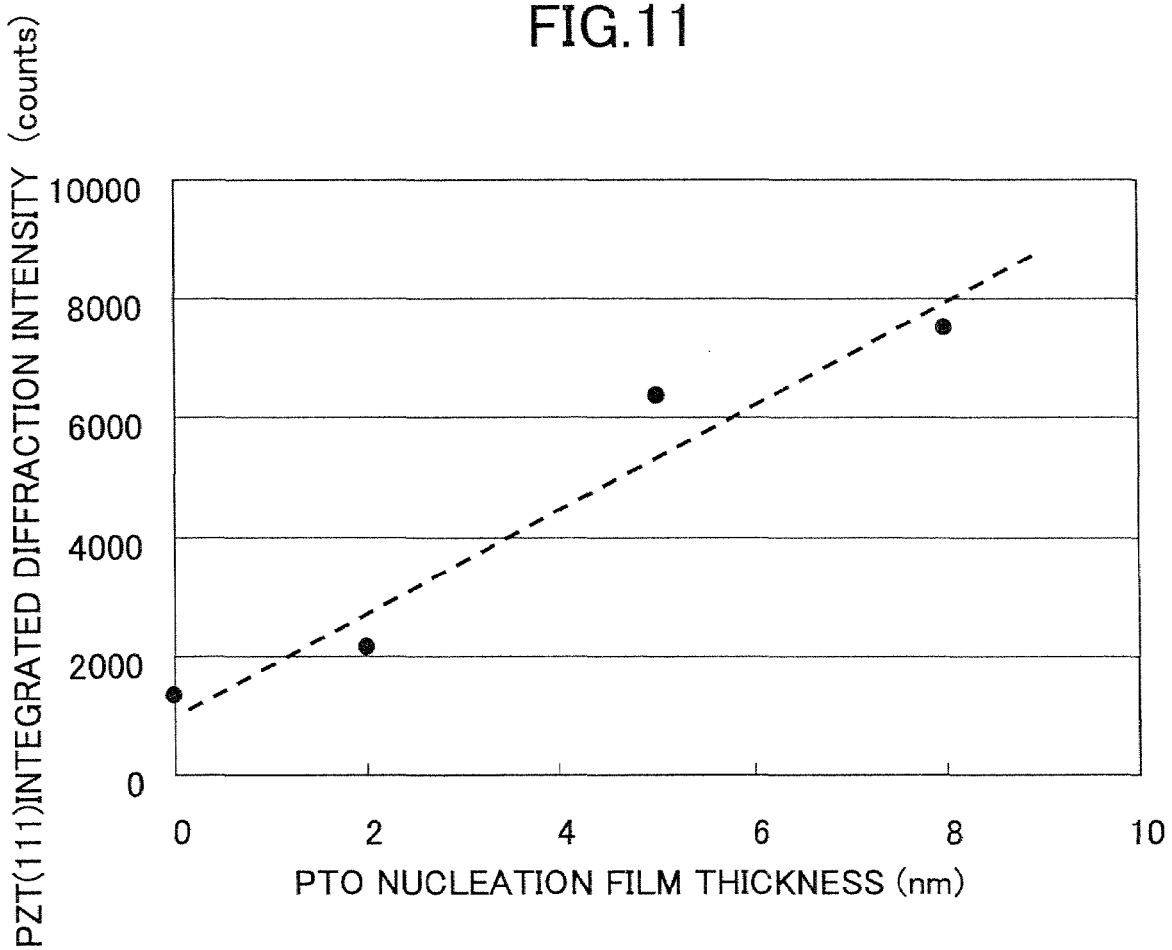
FIG. 11 is a diagram showing the relationship between the film thickness of the PTO nucleation layer and the orientation of the PZT film formed with the first embodiment of the present invention.

FIG. 11 shows the relationship corresponding to the X-ray diffraction patterns of FIGS. 9 and 10 between the diffraction intensity of (111) surface of the PZT film 23 and the film thickness of the PTO nucleation layer 22.

Referring to FIG. 11, it can be seen that the diffraction intensity of the PZT (111) surface is low and the degree of (111) surface orientation of the PZT film thus obtained is low when the PTO nucleation layer 22 is not formed or when the thickness thereof is 2 nm or less.

In the case the PTO nucleation layer 22 is formed with a large thickness exceeding the thickness of 2 nm, on the other hand, it can be seen that the diffraction intensity of the PZT (111) increases three times or more.

Figure 12:
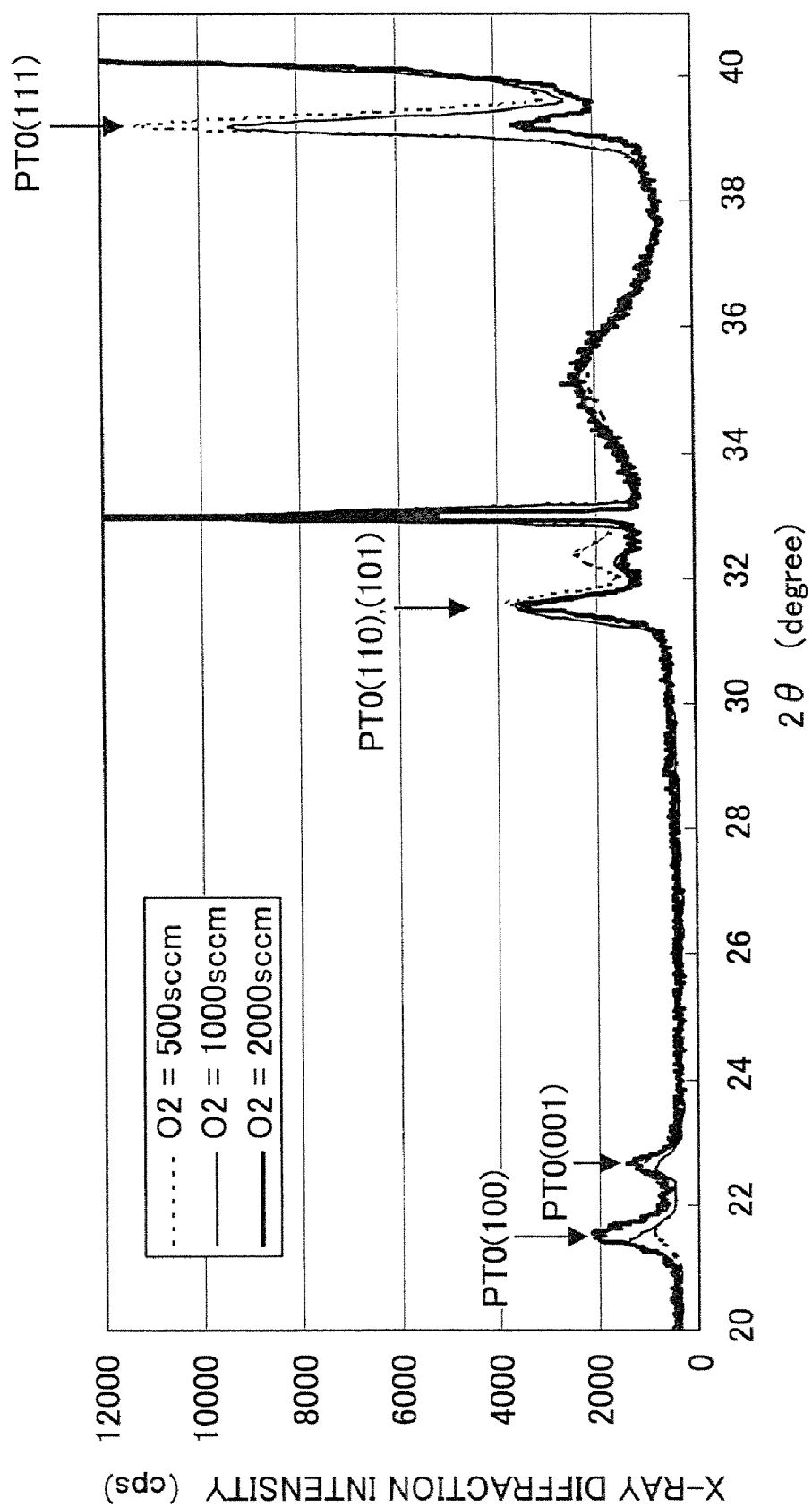
FIG. 12 is a diagram showing an X-ray diffraction pattern of the PZT film formed with the first embodiment of the present invention.
Figure 13:
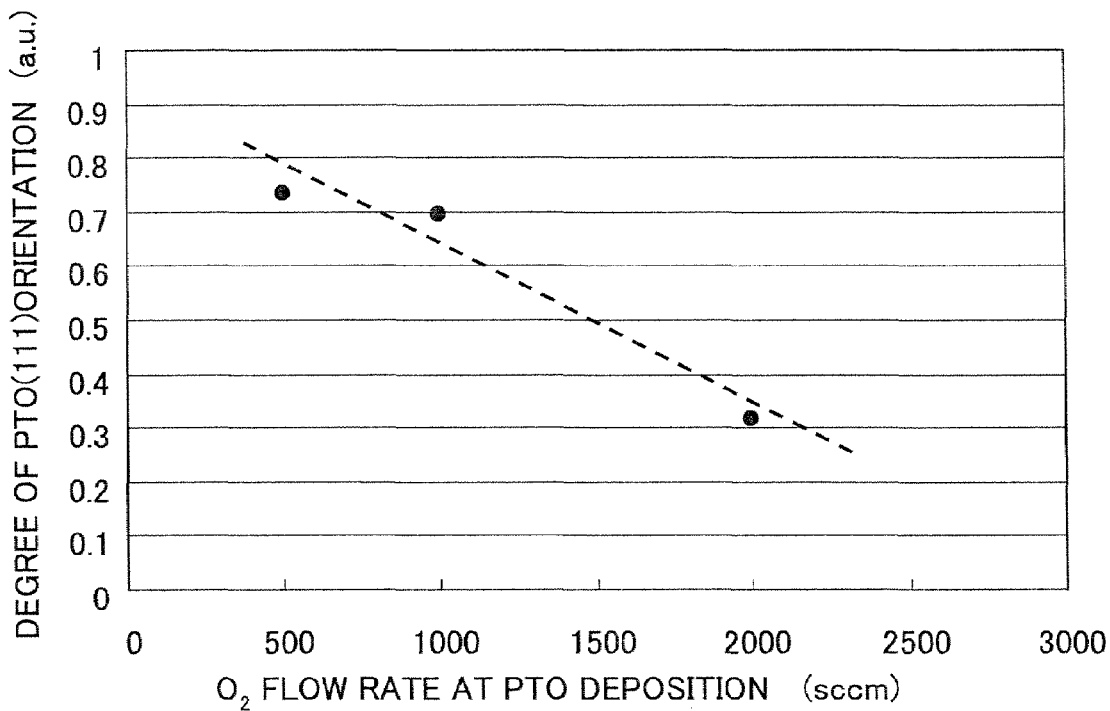
FIG. 13 is a diagram showing the relationship between the orientation and the oxygen flow rate of the PTO film formed with the first embodiment of the present invention.

FIG. 12 shows the X-ray diffraction pattern of the PTO nucleation layer 22 thus formed, while FIG. 13 shows the relationship between the oxygen flow rate at the time of deposition of the PTO nucleation layer 22 and the degree of (111) surface orientation of the PTO nucleation layer 22 corresponding to the X-ray diffraction pattern of FIG. 12. Further, FIG. 14 shows the relationship of FIG. 13 in terms of the relationship between the oxygen partial pressure at the time of deposition of the PTO nucleation layer 22 and the degree of (111) surface orientation of the PTO nucleation layer 22.

Referring to FIG. 13, it can be seen that the degree of (111) surface orientation of the PTO nucleation layer 22 itself changes with the oxygen flow rate, and thus oxygen partial pressure, at the time of deposition of the PTO nucleation layer 22 similarly to case of the PZT film 23 explained previously with reference FIGS. 7 and 8, while this indicates that the changes of the degree of (111) surface orientation of the PZT film 23 reflects the degree of (111) surface orientation of the PTO nucleation layer 22 that forms the underlying layer.

Figure 14:
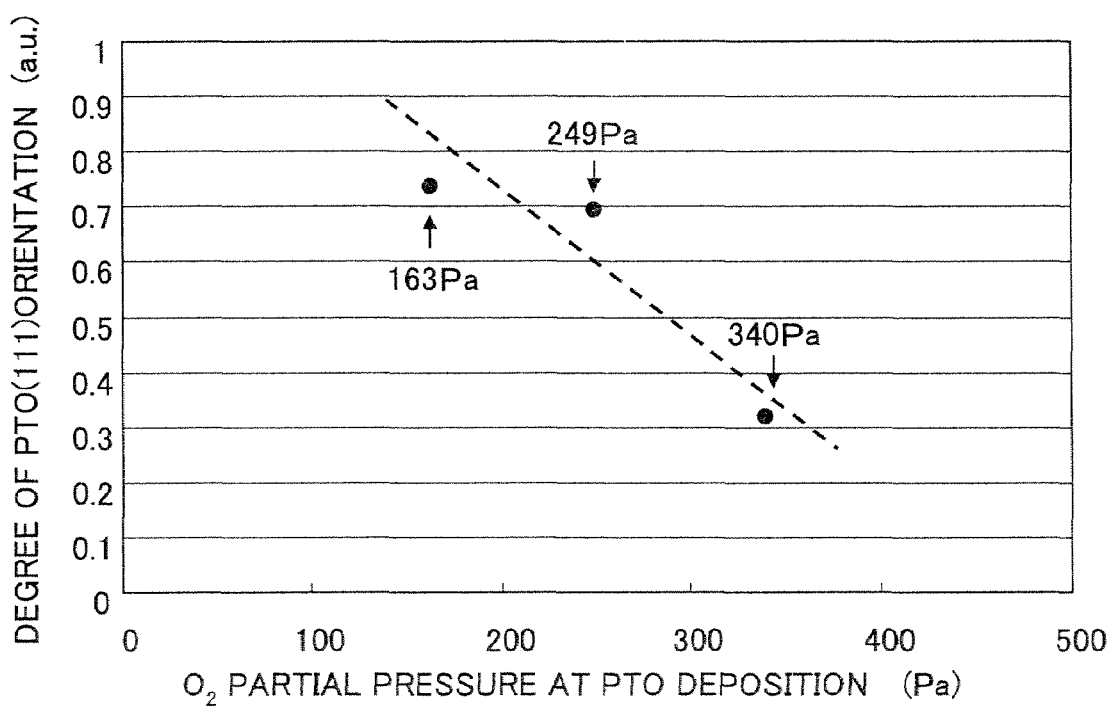
FIG. 14 is a diagram showing the relationship between the orientation and the oxygen partial pressure of the PTO film formed with the first embodiment of the present invention.
Figure 15:
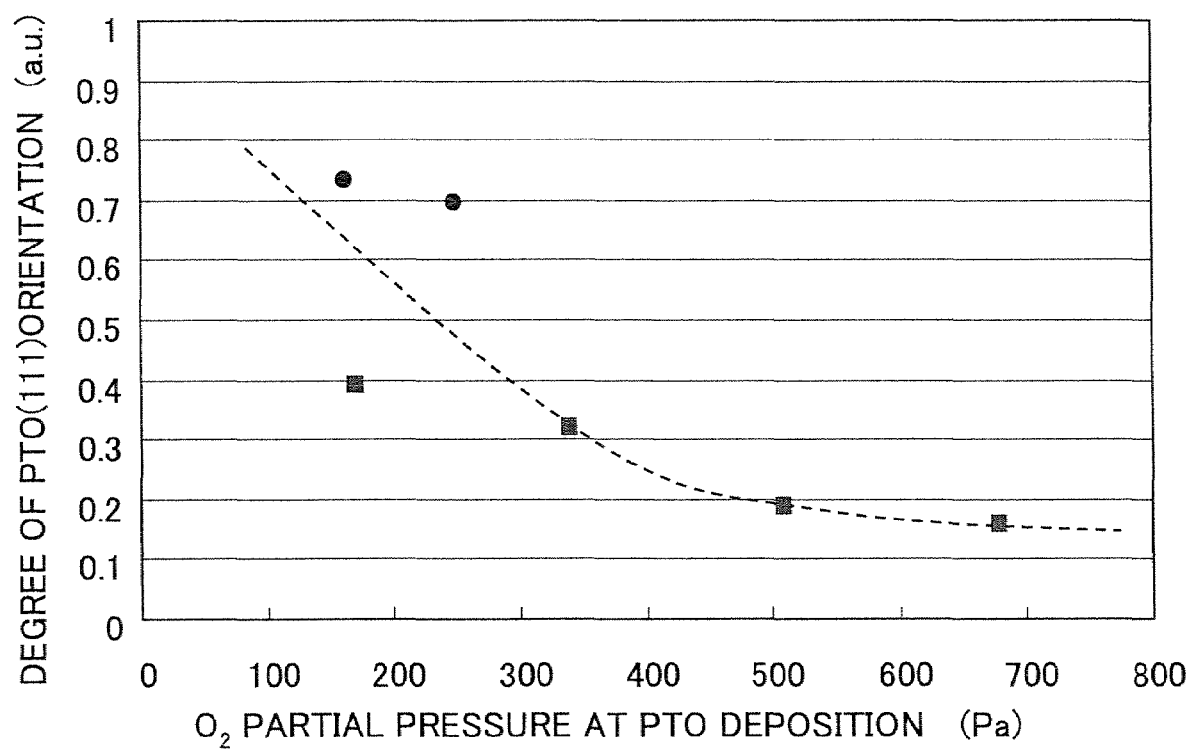
FIG. 15 is another diagram showing the relationship between the orientation and the oxygen partial pressure of the PTO film formed with the first embodiment of the present invention.

FIG. 15 is a diagram showing the degree of (111) surface orientation of the PTO nucleation layer 22 for the case of increasing the oxygen partial pressure further at the time of formation of the PTO nucleation layer 22 in the experiment of the FIG. 14.

Referring to FIG. 15, it can be seen that the degree of (111) surface orientation converges to the value of about 0.2 in the case that the oxygen partial pressure at the time of formation of the PTO nucleation layer 22 is increased beyond 340 Pa.

Figure 16:
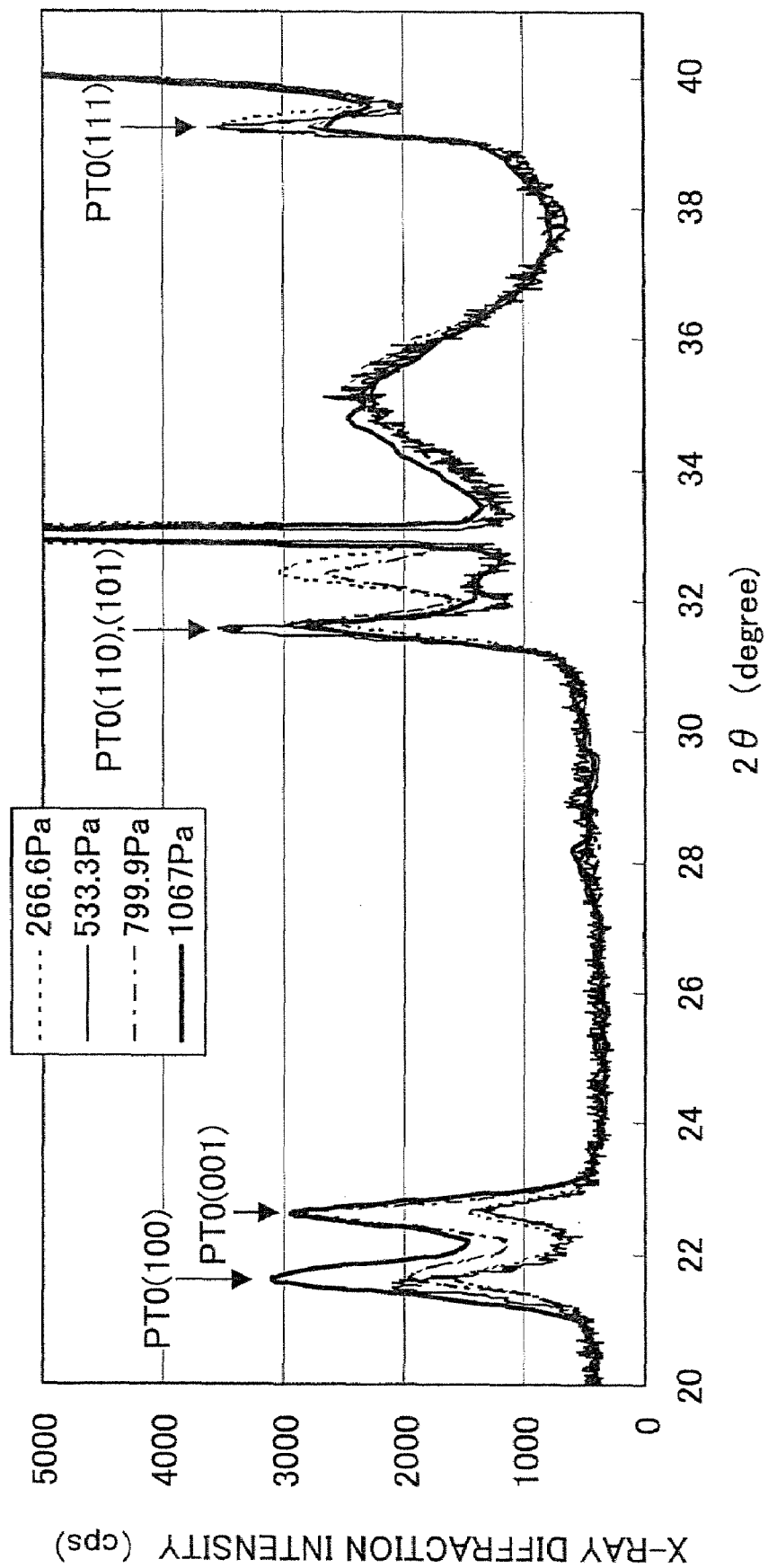
FIG. 16 is a diagram showing an X-ray diffraction pattern of the PZT film formed with the first embodiment of the present invention.
Figure 17:
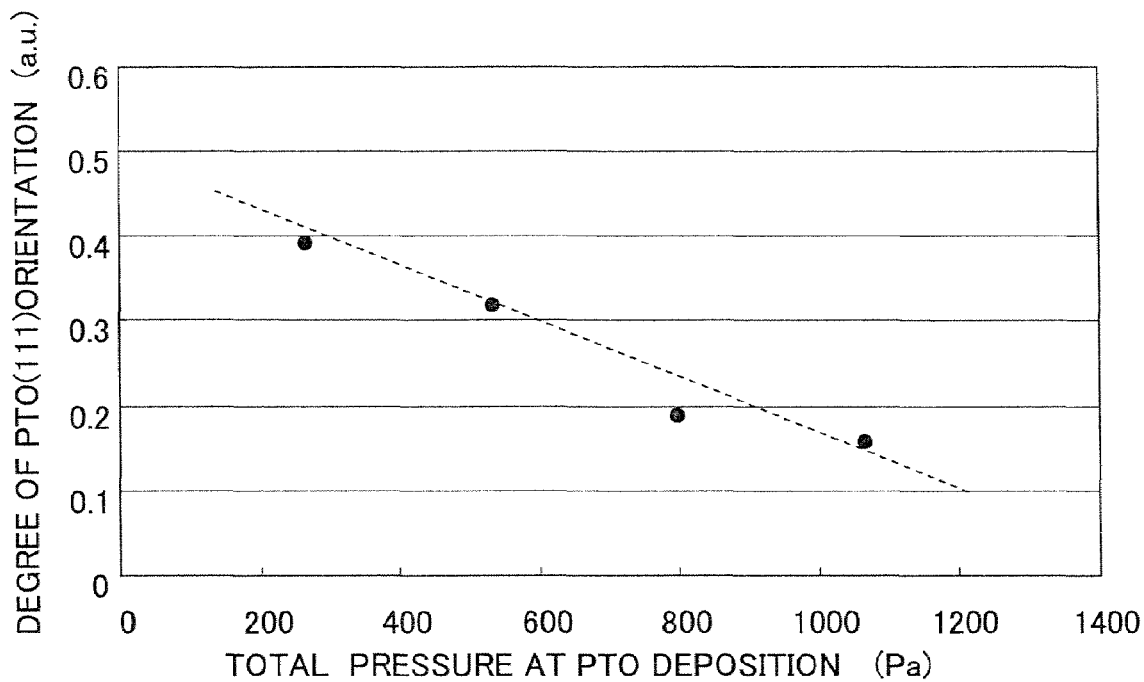
FIG. 17 is a diagram showing the relationship between the orientation and total partial pressure of the PTO film formed with the first embodiment of the present invention.

FIG. 16 shows the X-ray diffraction pattern of the PTO nucleation layer 22 obtained in the case the film formation of the PTO nucleation layer 22 of the step 3 of FIG. 3 was conducted while changing the total pressure of the MOCVD process, while FIG. 17 shows the relationship between the degree of (111) surface orientation of the PTO nucleation layer 22 thus obtained and the total pressure corresponding to FIG. 16.

Referring to FIG. 17, the degree of (111) surface orientation of the PTO nucleation layer 22 changes also on the total pressure at the time of formation of the PTO nucleation layer 22 and it can be seen that the degree of (111) PTO surface orientation increases with decrease of the total pressure in the region of the total pressure of 1000 Pa or less.

Figure 18A:
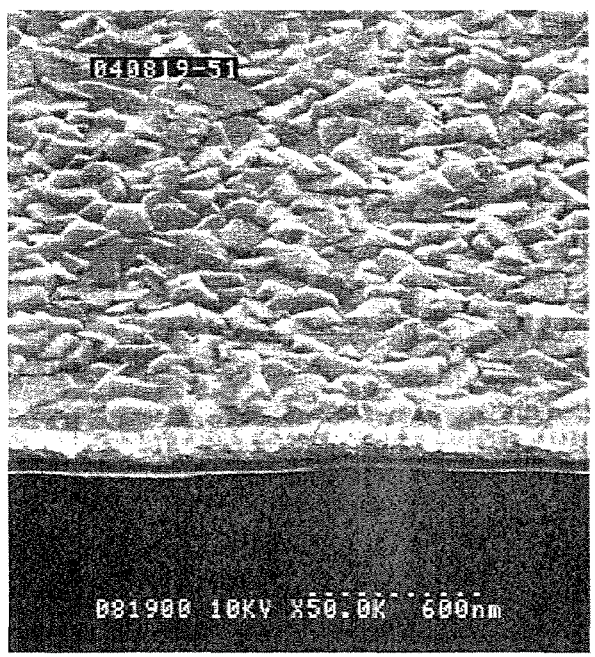
FIGS. 18A-18C are diagrams showing a SEM photograph of the surface of the PZT film formed with the first embodiment of the present invention.
Figure 18B:
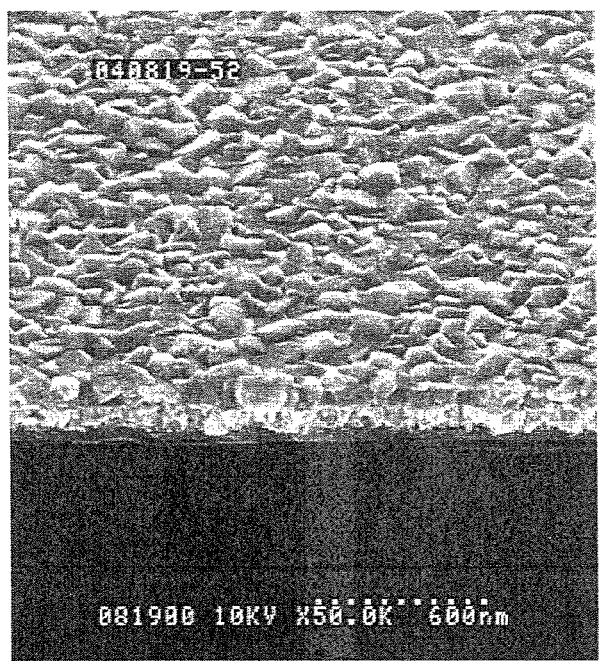
Figure 18C:
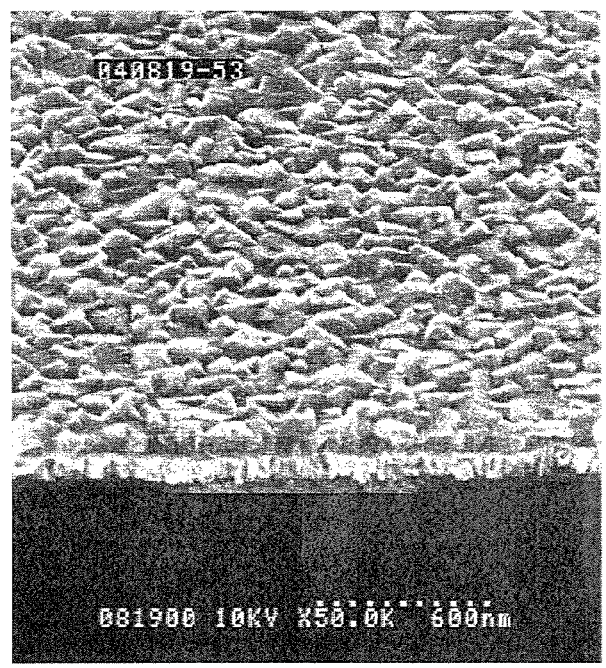
Figure 19:
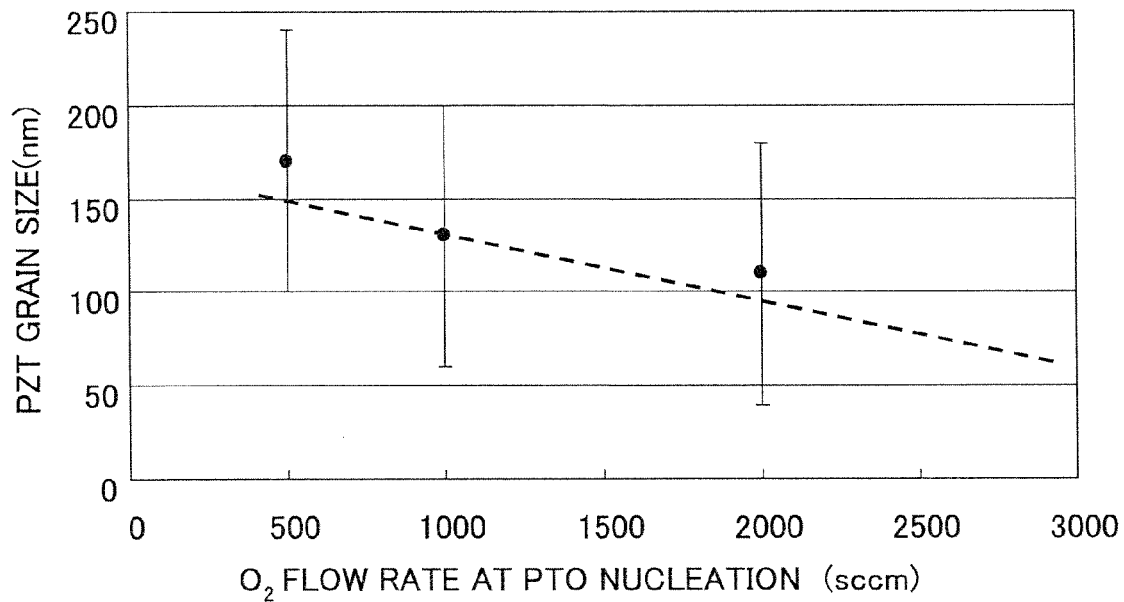
FIG. 19 is a diagram showing the relationship between the grain size of the PZT film formed with the first embodiment of the present invention and the oxygen flow rate at the time of formation of the PTO nucleation layer.
Figure 20:
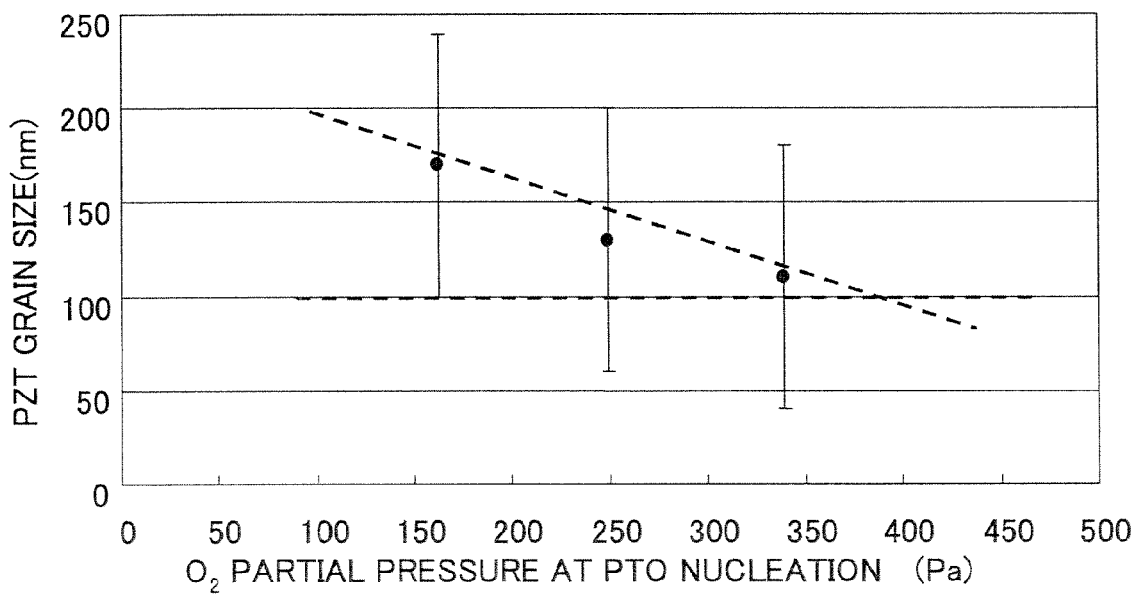
FIG. 20 is a diagram showing the relationship between the grain size of the PZT film formed with the first embodiment of the present invention and the oxygen partial pressure at the time of formation of the PTO nucleation layer.

FIGS. 18A, 18B and 18C are SEM photographs showing the surface state of the PZT film for the case the foregoing PZT nucleation layer 22 is formed with the oxygen flow rates of 500 SCCM, 1000 SCCM and 2000 SCCM and the PZT film 23 is formed further thereon with the oxygen flow rate of 2000 SCCM. Further, FIG. 19 is a diagram corresponding to FIGS. 18A-18C showing the relationship between the grain size of PZT crystals in the PZT film 23 and the oxygen flow rate at the time of formation of the PTO nucleation layer 22. Further, FIG. 20 is a diagram showing the relationship of FIG. 19 in terms of the relationship between the grain size of the PZT crystals and the oxygen partial pressure at the time of the formation of the PTO nucleation layer 22.

Referring to FIG. 19, 20, it can be seen that the crystal grain size in the PZT film 23 changes with the oxygen flow rate or oxygen partial pressure at the time of formation of the PTO nucleation layer 22 functioning as the underlying layer. Particularly, it can be seen that the crystal grain size increases when the oxygen flow rate or oxygen partial pressure is decreased.

FIGS. 21A-21D show the surface state and cross-sectional structure of the PZT film 23 obtained in the case of changing the film thickness of the PTO nucleation layer 22. Here, it should be noted that FIG. 21A shows the case in which formation of the PTO nucleation layer 22 is not made while FIGS. 21B, 21C and 21D show the cases in which the film thickness of the PTO nucleation layer 22 is set to 2 nm, 5 nm and 8 nm, respectively.

Figure 22:
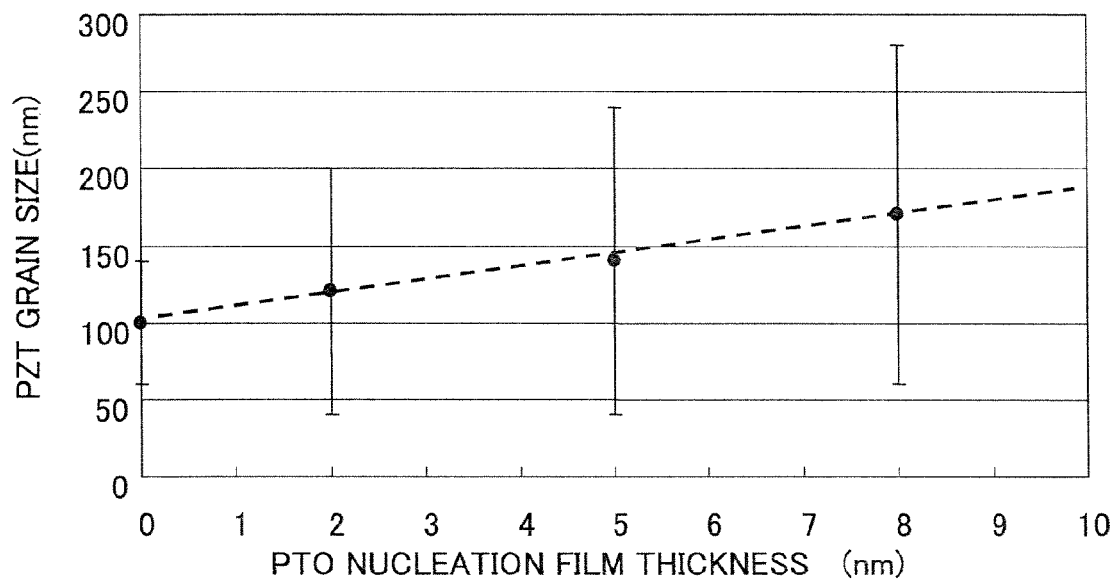
FIG. 22 is a diagram showing the relationship between the grain size of the PZT film and the film thickness of the PTO nucleation layer formed with the first embodiment of the present invention.

Further, FIG. 22 shows the relationship between the grain size of the PZT crystals in the PZT film 23 and the film thickness of the PTO nucleation layer 22 corresponding to FIGS. 21A-21D.

Referring to FIG. 22, the grain size of PZT crystals in the PZT film 23 depends also on the film thickness of the PTO nucleation layer 22 and it can be seen that the crystal grain size increases when the film thickness of the PTO nucleation layer 22 is increased.

Thus, in the case a PTO nucleation layer is formed to the thickness beyond 2 nm, preferably 5 nm or more, more preferably 8 nm or more, under the preferable oxygen flow rate found previously of 2000 SCCM or less, preferably 1000 SCCM or less, more preferably 500 SCCM or less, or under the preferable oxygen partial pressure found previously of less than 340 Pa, preferably 249 Pa or less, more preferably 163 Pa or less, there occurs an increase in the crystal grain size of the PZT film 23 formed thereon, and the PZT film 23 becomes coarse. Because the surface of the PZT film 23 is comparatively flat even when formed under such a condition as shown in FIG. 21D, there arises no difficulty for formation of the upper electrode 24 thereon.

Figure 23A:
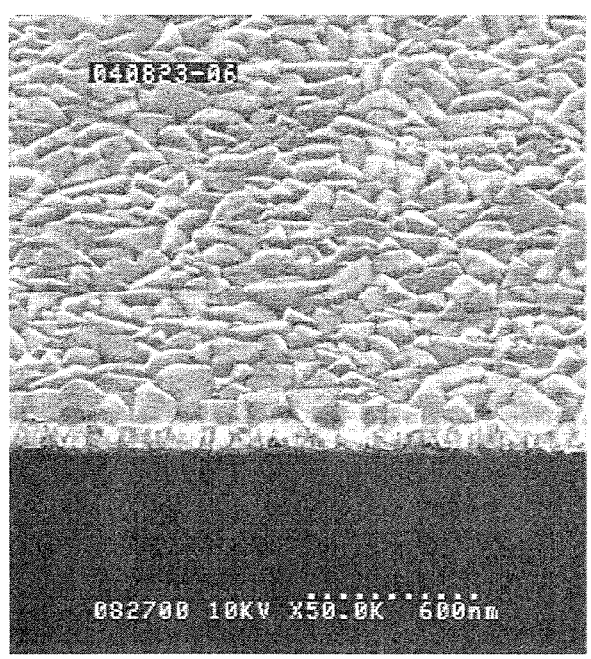
FIGS. 23A-23C are diagrams showing a SEM photograph of the surface of the PTO film formed with the first embodiment of the present invention.
Figure 23B:
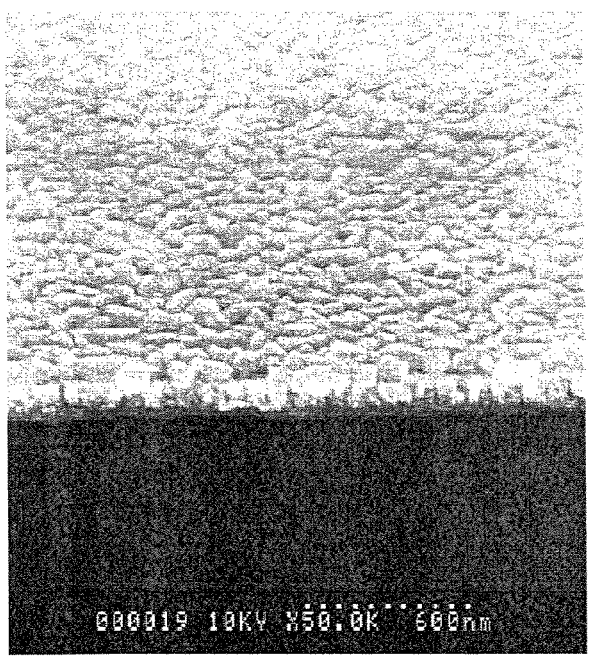
Figure 23C:
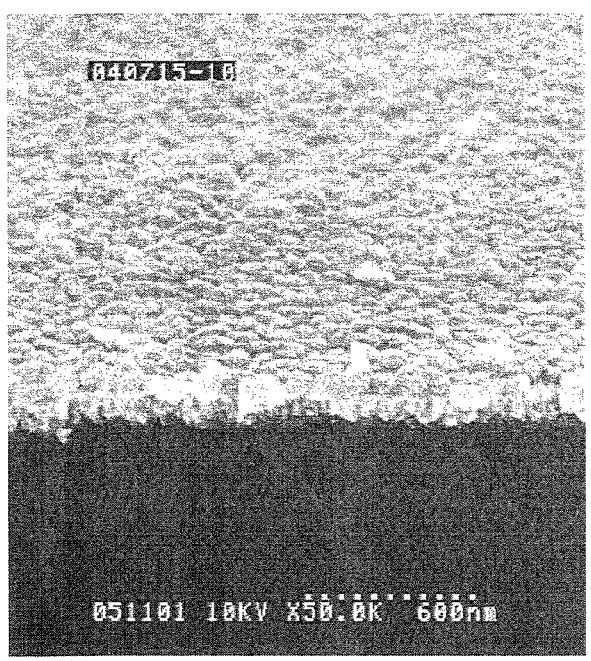

FIGS. 23A-23C show the surface state of the PTO nucleation layer 22 thus formed, wherein FIG. 23A shows the case of forming the PTO nucleation layer 22 under the oxygen flow rate of 500 SCCM, while FIG. 23B shows the case of forming the PTO nucleation layer 22 under the flow rate of 1000 SCCM. Further, FIG. 23C shows the case of forming the PTO nucleation layer 22 under the flow rate of 2000 SCCM.

Figure 24:
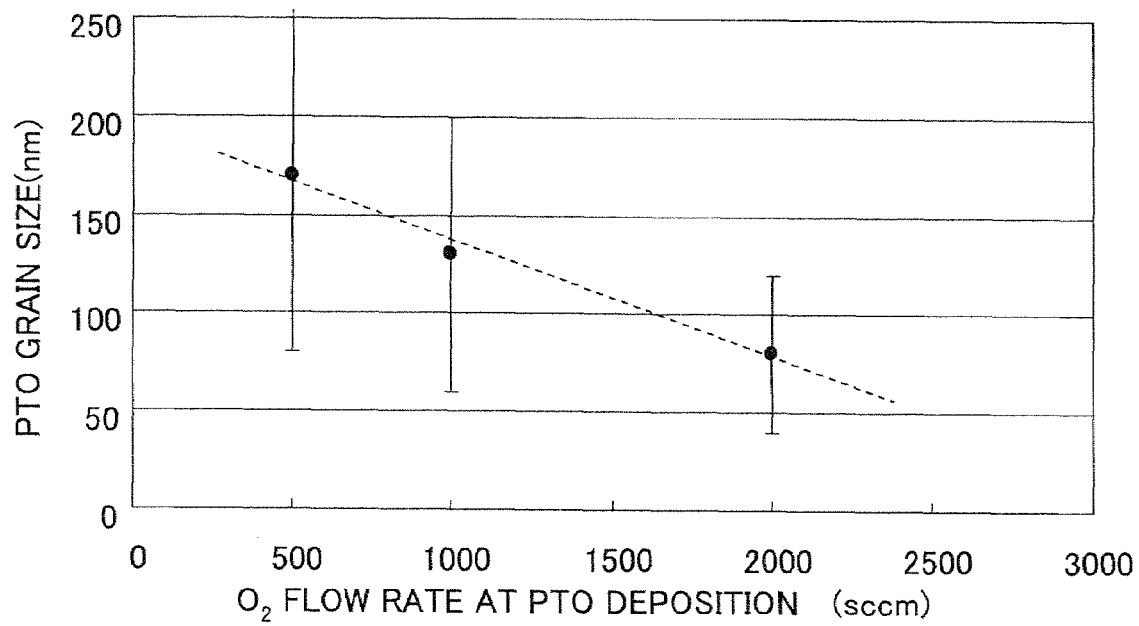
FIG. 24 is a diagram showing relationship between the grain size of the PTO film formed with the first embodiment of the present invention and the oxygen flow rate at the time of formation of the PTO nucleation layer.

Further, FIG. 24 is a diagram showing the relationship between the crystal grain size of the PTO nucleation layer 22 and the oxygen flow rate at the time of formation of the PTO nucleation layer 22 corresponding to FIG. 23A-FIG. 23C. Further, FIG. 25 is a diagram showing the relationship of FIG. 24 in the form of the relationship between the grain size of PTO crystals and the oxygen partial pressure.

Figure 25:
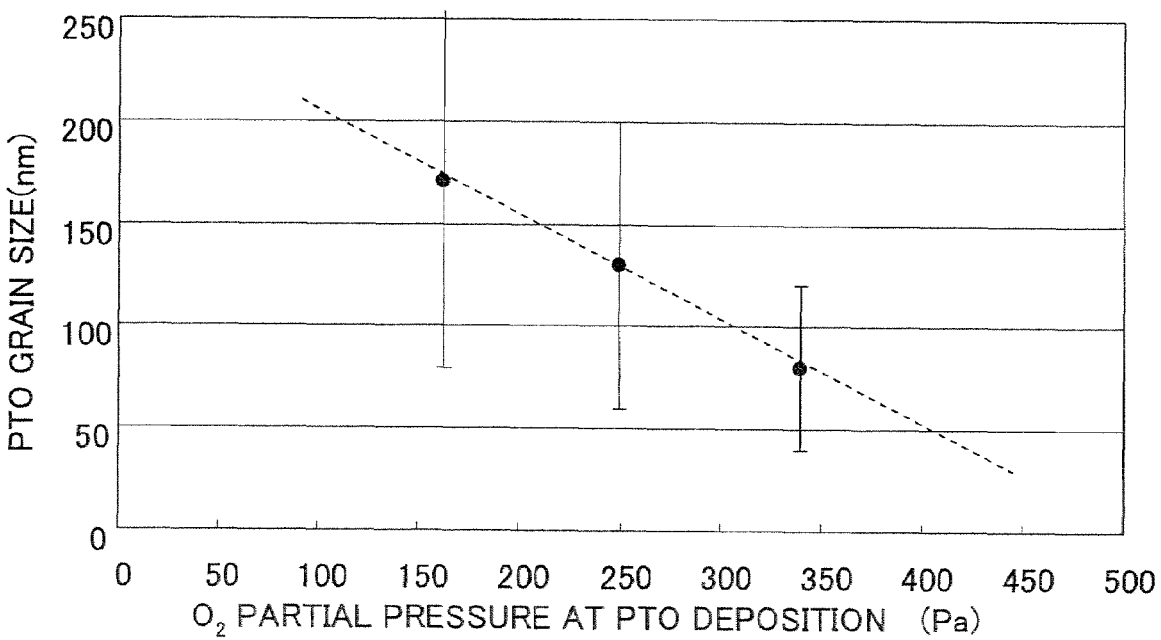
FIG. 25 is a diagram showing the relationship between the grain size of the PTO film that are formed by the first embodiment of the present invention and the oxygen partial pressure at the time of formation of the PTO nucleation layer.

Referring to FIGS. 24 and 25, the grain size of the PTO crystals in the PTO nucleation layer 22 changes also with the oxygen flow rate or oxygen partial pressure at the time of formation of the PTO nucleation layer 22, and it can be seen particularly that the grain size increases when the oxygen flow rate or oxygen partial pressure is decreased. From this, it is understood that the relationship between the oxygen flow rate or oxygen partial pressure at the time of formation of the PZT film and the PTO nucleation layer 22 shown in FIGS. 19 and 20 reflects the surface state of the PTO nucleation layer 22 of FIGS. 24 and 25.

Figure 26A:
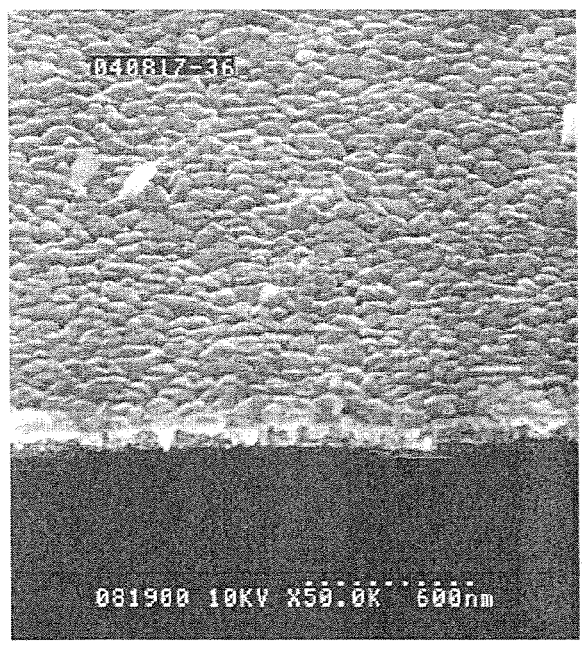
FIGS. 26A-26D are diagrams showing SEM photograph of the surface of the PTO film formed with the first embodiment of the present invention.
Figure 26B:
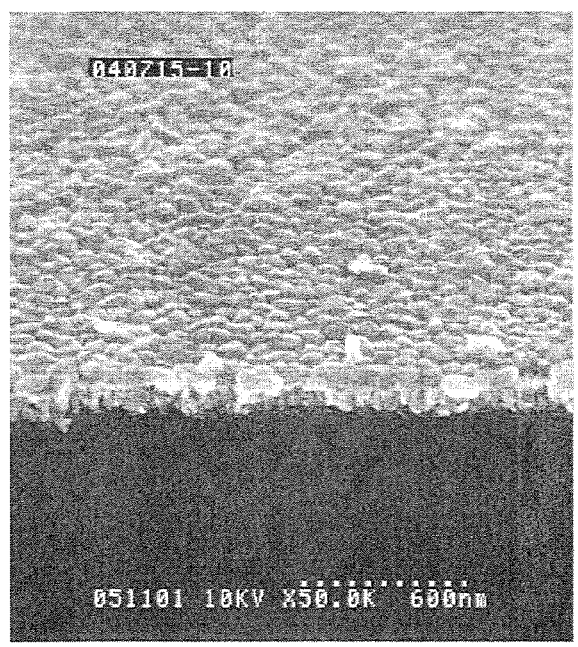
Figure 26C:
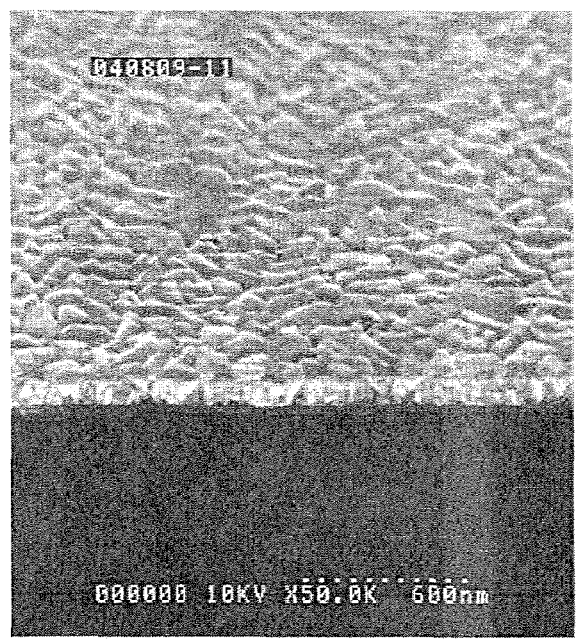
Figure 26D:
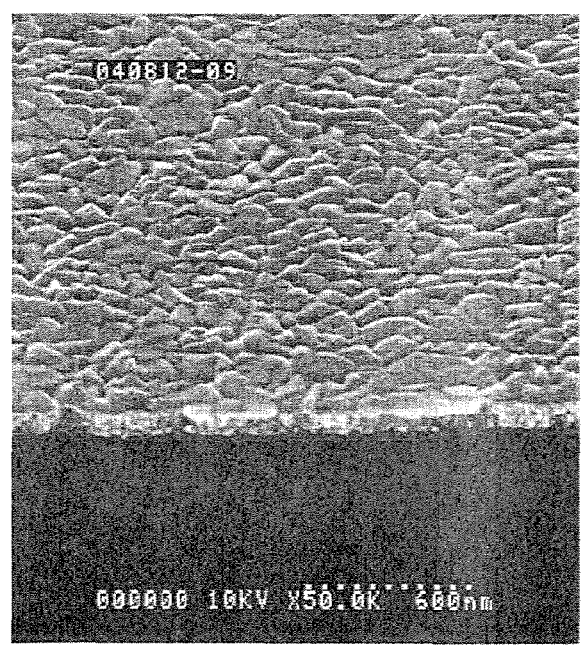

FIGS. 26A-26D are diagrams showing the surface state of the PTO nucleation layer 22 for the case of changing the total pressure when forming the PTO nucleation layer 22 in the process of the step 3 of FIG. 3. Here it should be noted that FIG. 26A shows the case of conducting the film formation of the PTO nucleation layer 22 under the total pressure of 266.6 Pa, while FIG. 26B shows the case of conducting the film formation of the PTO nucleation layer 22 under the total pressure of 533.3 Pa. Further, FIG. 26C shows the case of conducting the film formation of the PTO nucleation layer 22 under the total pressure of 799.9 Pa, while FIG. 26D shows the case of conducting the film formation of the PTO nucleation layer 22 under the total pressure of 1067 Pa.

Figure 27:
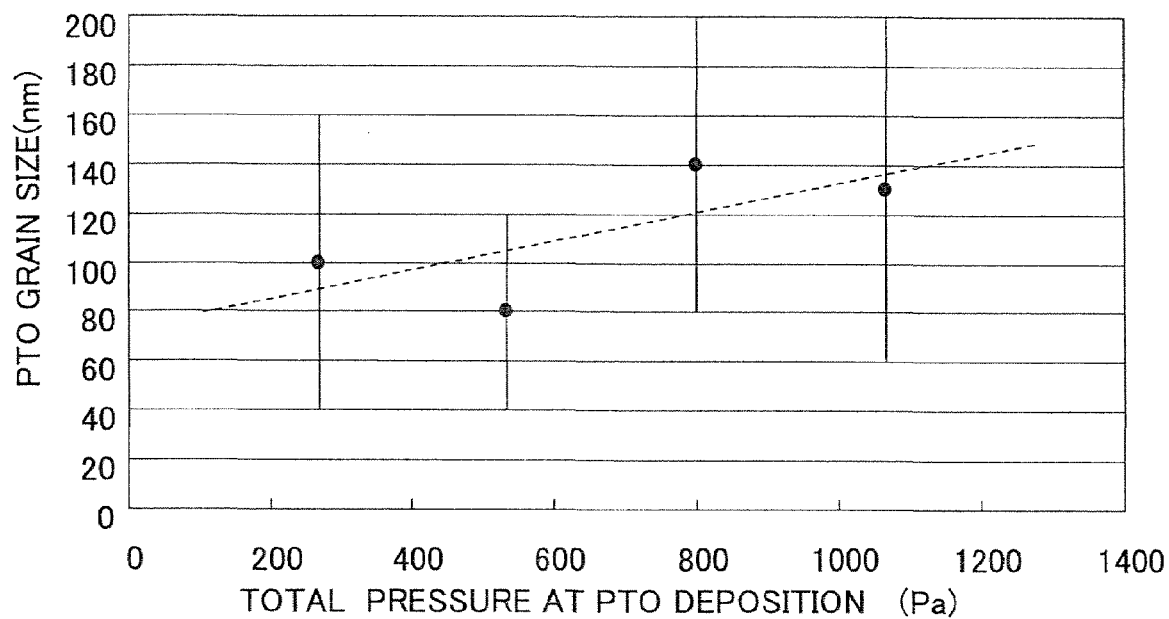
FIG. 27 is a diagram showing the relationship between the grain size of the PTO film formed with the first embodiment of the present invention and the total pressure at the time of formation of the PTO nucleation layer.

FIG. 27 shows the relationship between the grain size of the PTO crystals in the PTO nucleation layer 22 and the total pressure at the time of formation of the PTO nucleation layer film corresponding to FIGS. 26A-26D.

Referring to FIG. 27, it can be seen that the grain size of the PTO crystals in the PTO nucleation layer 22 depends also on the total pressure at the time of the film formation of the PTO nucleation layer 22 and that the crystal grain size increases with increase of the total pressure.

Figure 28A:
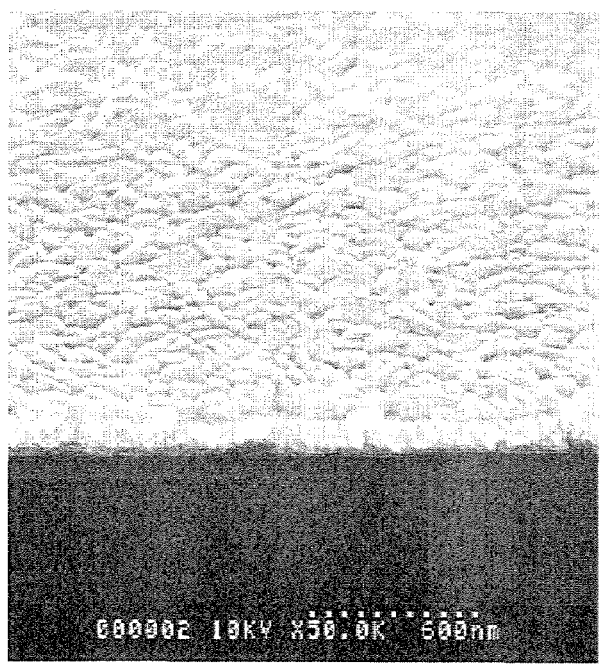
FIGS. 28A-28C are diagrams showing SEM photograph of the surface of the PTO film formed with the first embodiment of the present invention.
Figure 28B:
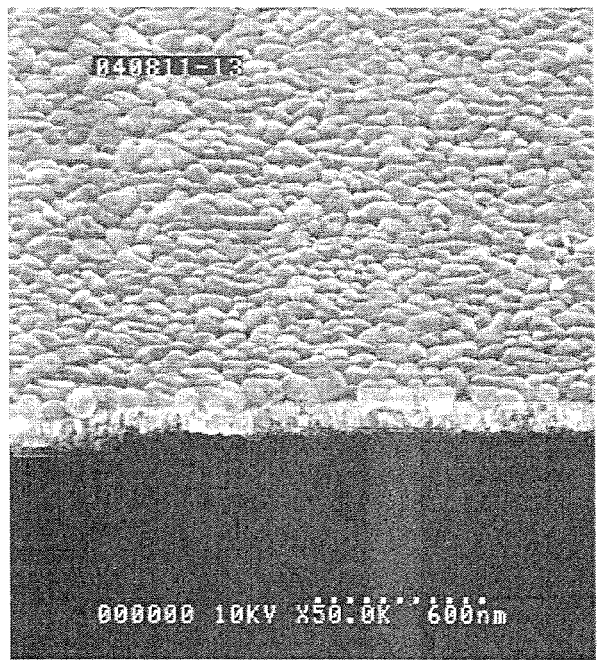
Figure 28C:
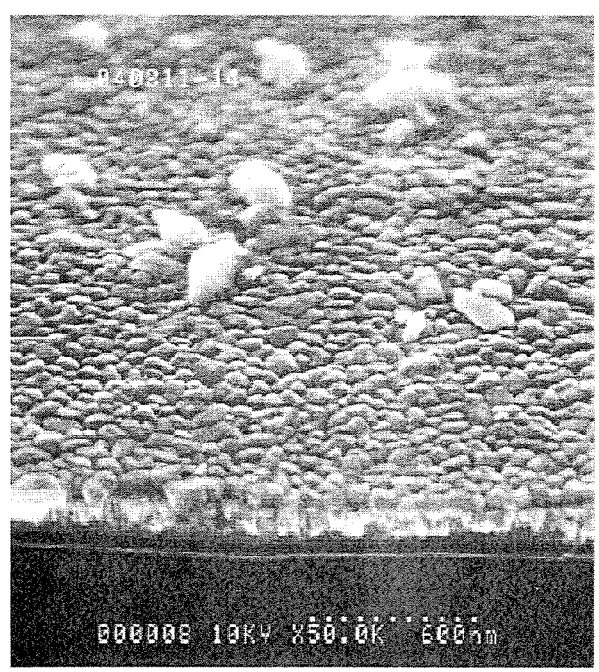

FIG. 28A is a diagram showing the surface state of the PTO film 22 obtained for the case of supplying the liquid metal-organic source of Pb with the flow rate 0.24 ml/minute in the formation process of the PTO nucleation layer 22 of the step 3 of FIG. 3 (Pb/Ti elemental compositional ratio in the PTO film=1.04, Pb/Ti flow rate ratio of the supplied liquid metal-organic sources=0.96), while FIG. 28B is a diagram showing the surface state of the PTO film 22 obtained for the case of supplying the liquid metal-organic source of Pb with the flow rate 0.25 ml/minute (Pb/Ti elemental compositional ratio in the PTO film=1.03, Pb/Ti flow rate ratio of the supplied liquid metal-organic sources=1.00). Further, FIG. 28C is a diagram showing the surface state of the PTO film 22 obtained for the case of supplying the liquid metal-organic source of Pb with the flow rate 0.27 ml/minute (Pb/Ti elemental compositional ratio in the PTO film=1.09, Pb/Ti flow rate ratio of the supplied liquid metal-organic sources=1.08). In any of the cases the liquid metal-organic source of Ti is supplied with the flow rate of 0.25 ml/minute, and the total flow rate of the liquid source materials supplied to the vaporizer 14 is set to 1.2 ml/minute.

Referring to FIGS. 28A-28C, it can be seen that the obtained PTO film has a flat surface in the specimens of FIGS. 28A and 28B, while with the specimen of FIG. 28C, abnormal growth of giant crystal is observed on the PTO film surface.

Figure 29:
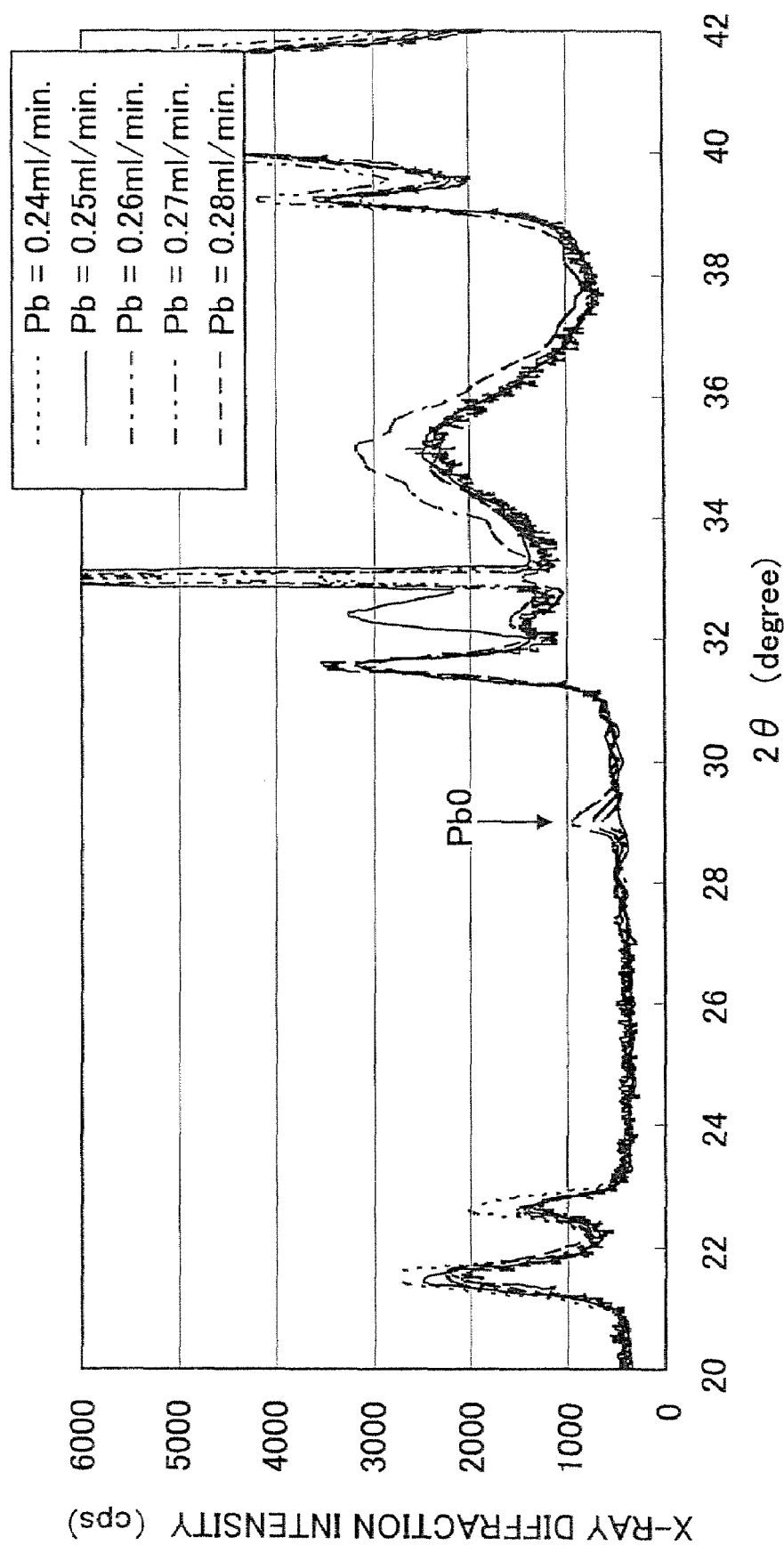
FIG. 29 is a diagram showing an X-ray diffraction pattern of the PTO film formed with the first embodiment of the present invention.

FIG. 29 shows an X-ray diffraction pattern of the PTO film specimen formed by changing the flow rate of the liquid metal-organic source of Pb supplied to vaporizer 14 variously in the nucleation layer formation process 3 of FIG. 3.

Referring to FIG. 29, it can be seen that there appears a peak of PbO at about 29 degrees of the 2θ angle.

Figure 30:
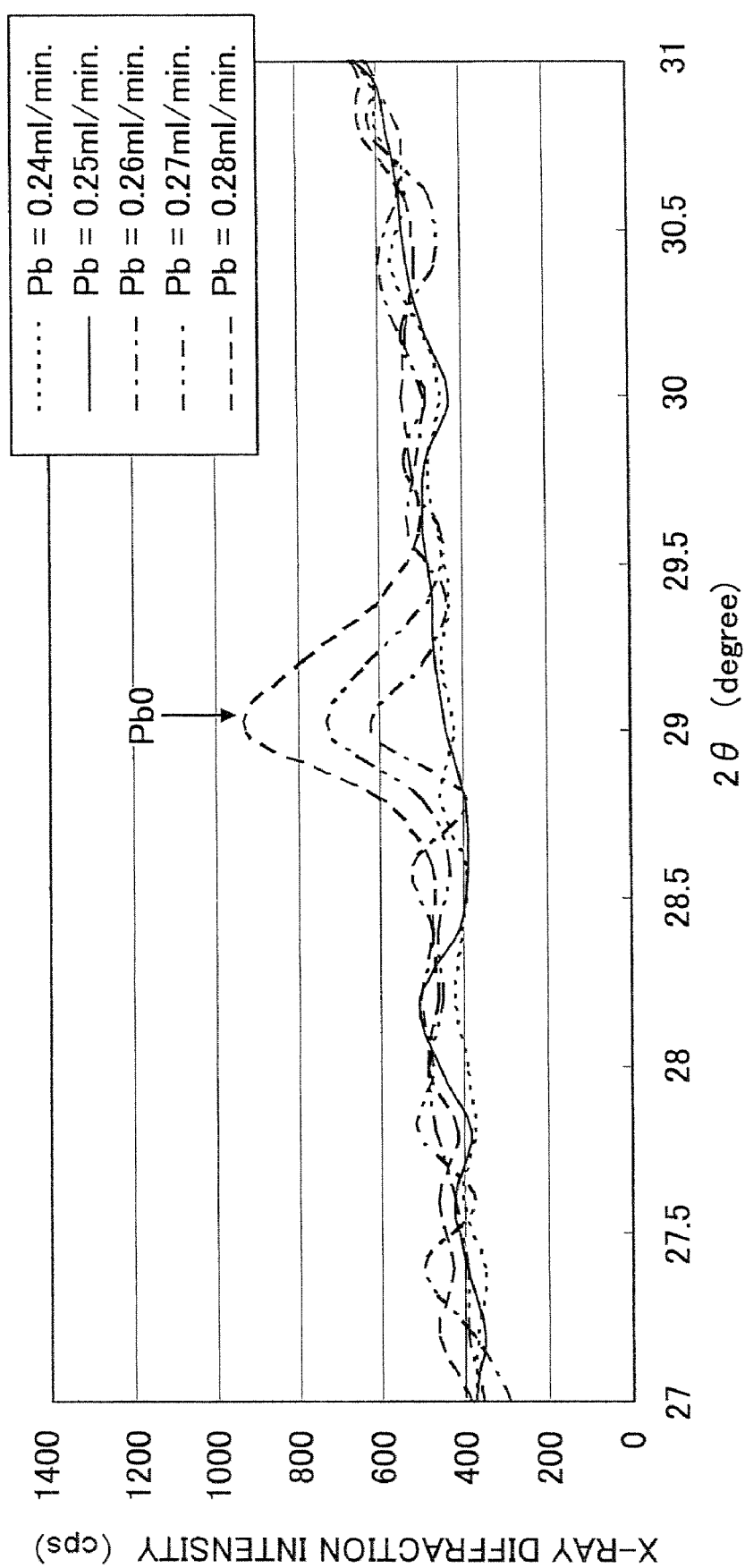
FIG. 30 is a diagram showing a part of X-the ray diffraction patterns of FIG. 29 with enlarged scale.

FIG. 30 is a diagram showing a part of the X-ray diffraction pattern of FIG. 29 in the vicinity of the diffraction peak of PbO with enlarged scale.

Referring to FIG. 30, there is observed an increase of height in the diffraction peak of the PbO for the case when the flow rate of Pb is increased, while this indicates that the giant crystal of FIG. 28C formed by the abnormal growth is PbOx.

Figure 31:
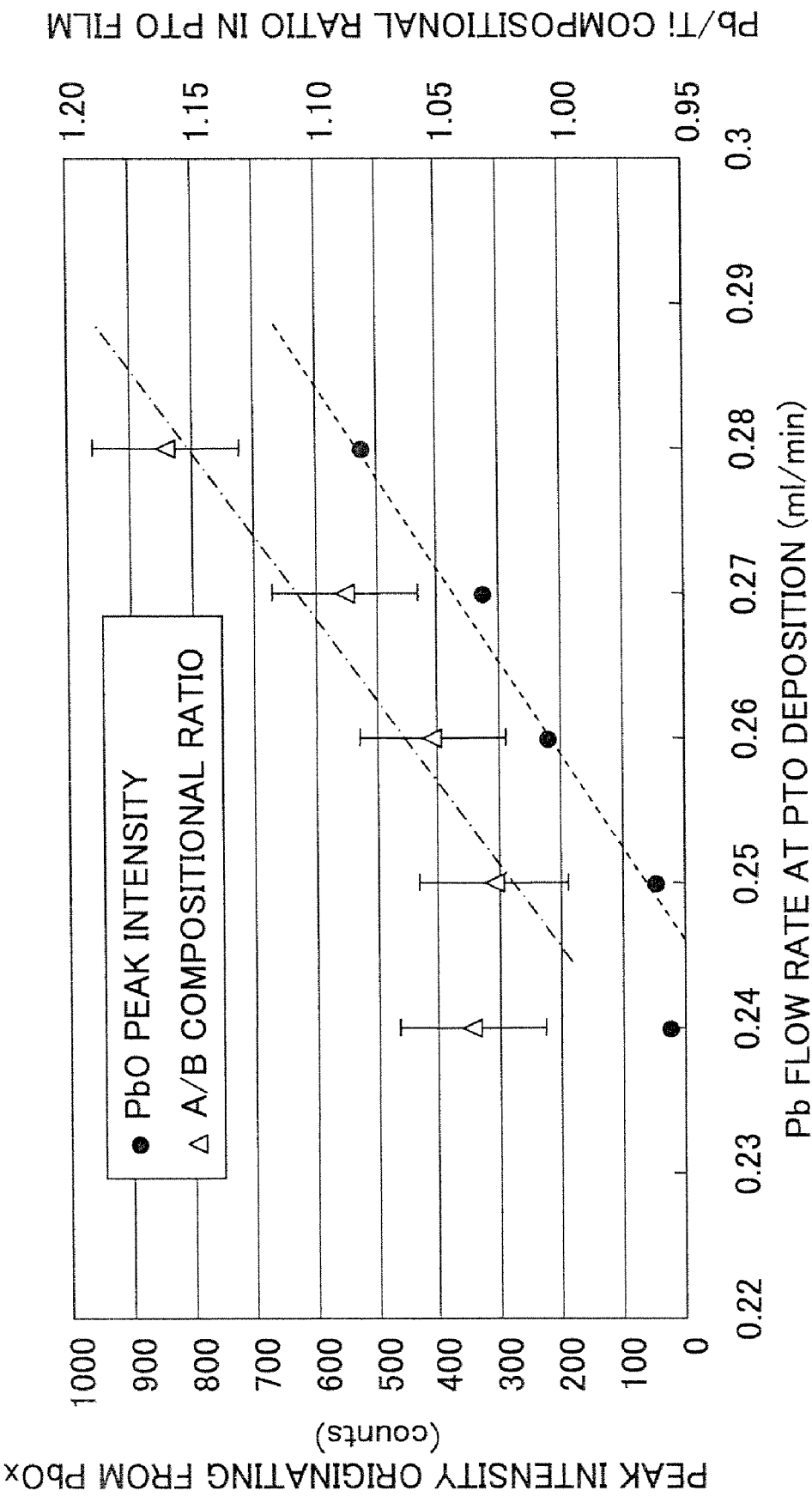
FIG. 31 is a diagram showing the relationship between the peak intensity of PbOx in the PTO film and the Pb flow rate formed with the first embodiment of the present invention.

FIG. 31 shows the relationship for the PbO diffraction peak intensity and the Pb/Ti elemental compositional ratio of the PTO film thus formed with regard to the flow rate of the Pb source material at the time of film formation PTO film.

As can be seen in FIG. 31, the peak of PbO is started to be observed when the flow rate of the Pb liquid metal-organic source has exceeded 0.25 ml/minute at the time of formation of the PTO film, thus indicating that abnormal growth of PbOx has already started at the PTO film surface. Further, it can be seen that the diffraction intensity of PbOx increases when the flow rate of the Pb source material supplied to the vaporizer 14 increased and thus the Pb/Ti ratio in the liquid source material is increased.

Such abnormal growth of PbOx on the PTO film has to be avoided in order to avoid degradation of the quality of the PZT film formed thereon. From this viewpoint, it is understood that it is desirable to set the elemental compositional ratio Pb/Ti between Pb and Ti in the PTO film to be less than 1.09, preferably to 1.05 or less and to set the Pb/Ti flow rate ratio of the liquid source material supplied vaporizer 14 in the MOCVD apparatus 10 of the FIG. 2 to be less than 1.08, preferably 1.00 or less.

Second Embodiment

With the previous embodiment, formation of the PZT film of the step 5 has been conducted after the preflow process in the step 4, which is conducted after the formation of the PTO nucleation layer 22 in the step 3, such that the supply of the gaseous metal-organic source is stabilized as shown in the flowchart of FIG. 3 and in the recipe (A)-(F) of FIG. 5.

In this case, however, the substrate W to be processed is maintained in the processing vessel 11 during the preflow process of the step 4, and thus, the substrate is susceptible to contamination by the volatile impurities such as Pb adhered to the vessel wall of the processing vessel 11.

Figure 32:
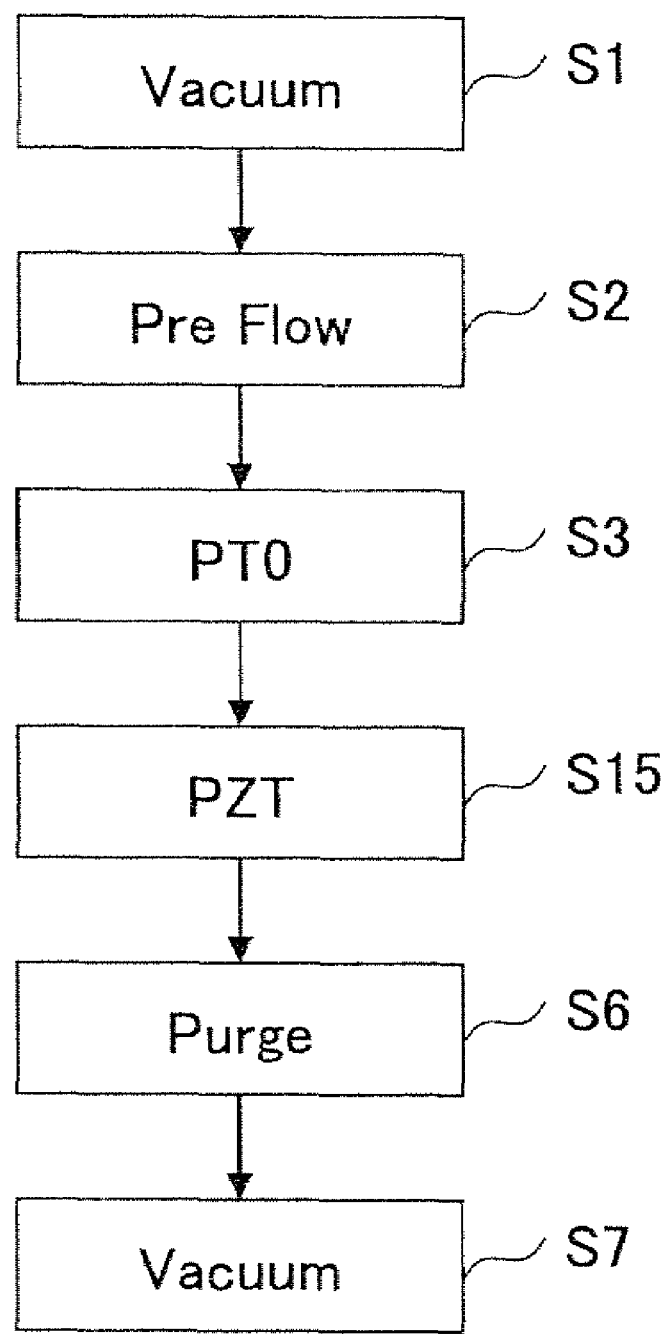
FIG. 32 is a flowchart showing the fabrication process of a semiconductor device according to a second embodiment of the present invention.

Contrary to this, FIG. 32 is a flowchart showing the film formation sequence of the PZT film according to a second embodiment of the present invention that uses the MOCVD apparatus 10 of FIG. 2. In FIG. 32, those steps corresponding to the steps explained previously are designated by the same reference numerals and the description thereof will be omitted.

Referring to FIG. 32, the present embodiment carries out formation of the PZT film 23 in a step 15 directly after formation of the PTO nucleation layer 22 in the step 3, without conducting the preflow process of the step 4 of the previous process of FIG. 3.

In this PZT film formation process of the step 15, each of the liquid mass-flow controllers 19A-19D of the MOCVD apparatus 10 of FIG. 2 is set up a flow rate preset value for the formation of the PZT film, while it should be noted that the liquid mass-flow controller has a characteristic of showing delayed response in the case the flow rate value is low. In the present case, the liquid mass-flow controller 19C that supplies the liquid metal-organic source of Zr tends to show the delayed response.

With the MOCVD apparatus 10 of FIG. 2, the vaporizer 14 is used to form the gaseous metal-organic source by supplying thereto various liquid metal-organic sources, while there is a need that the total flow rate of the liquid supplied to the atomizing nozzle 14a is constant in order that the evaporation of the liquid metal-organic source in the vaporizer 14 is conducted such that a predetermined partial pressure is obtained for the gaseous metal-organic source. Thus, in the case of supplying the respective liquid metal-organic sources to the line 16 with the predetermined flow rates by changing the flow rate preset values of the liquid mass-flow controllers 19B-19D, it is practiced to decrease the flow rate of the solvent by changing the flow rate preset value of the liquid mass-flow controller 19A used for supplying the solvent at the same time.

Figure 33:
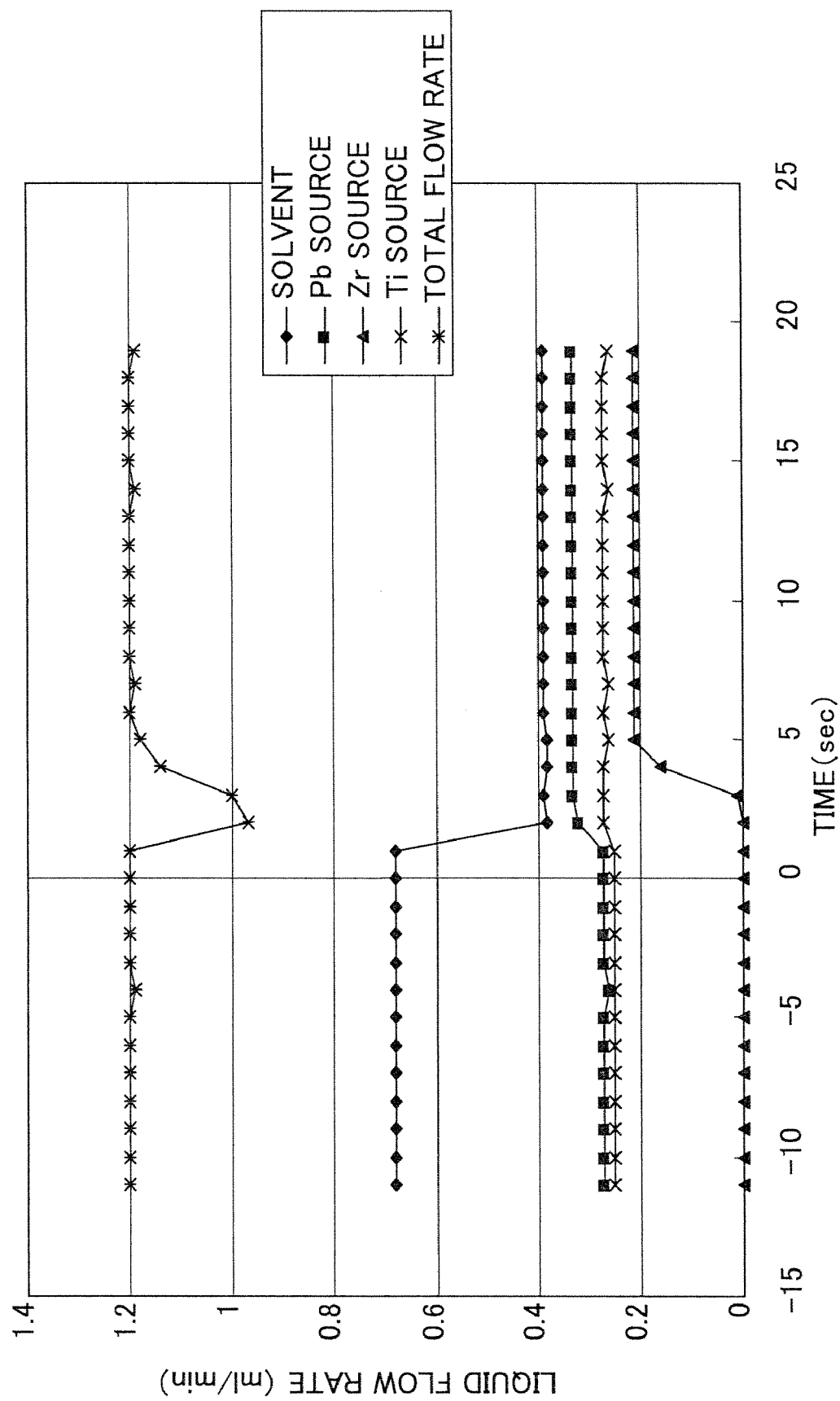
FIG. 33 is a diagram showing the problems to be solved by the second embodiment of the present invention.

On the other hand, in the case supply of a particular liquid metal-organic source, such as the liquid metal-organic source of Zr, is delayed with such a liquid metal-organic source supply system, there is caused momentary drop of the total flow rate of the liquids supplied to the vaporizer 14 at the start of the formation process of the PZT film as shown in FIG. 33, and thus, there is a possibility that the compositional ratio or partial pressure of the gaseous metal-organic sources formed as a result of evaporation is deviated from the value suitable for the formation of the desired PZT film.

Figure 34:
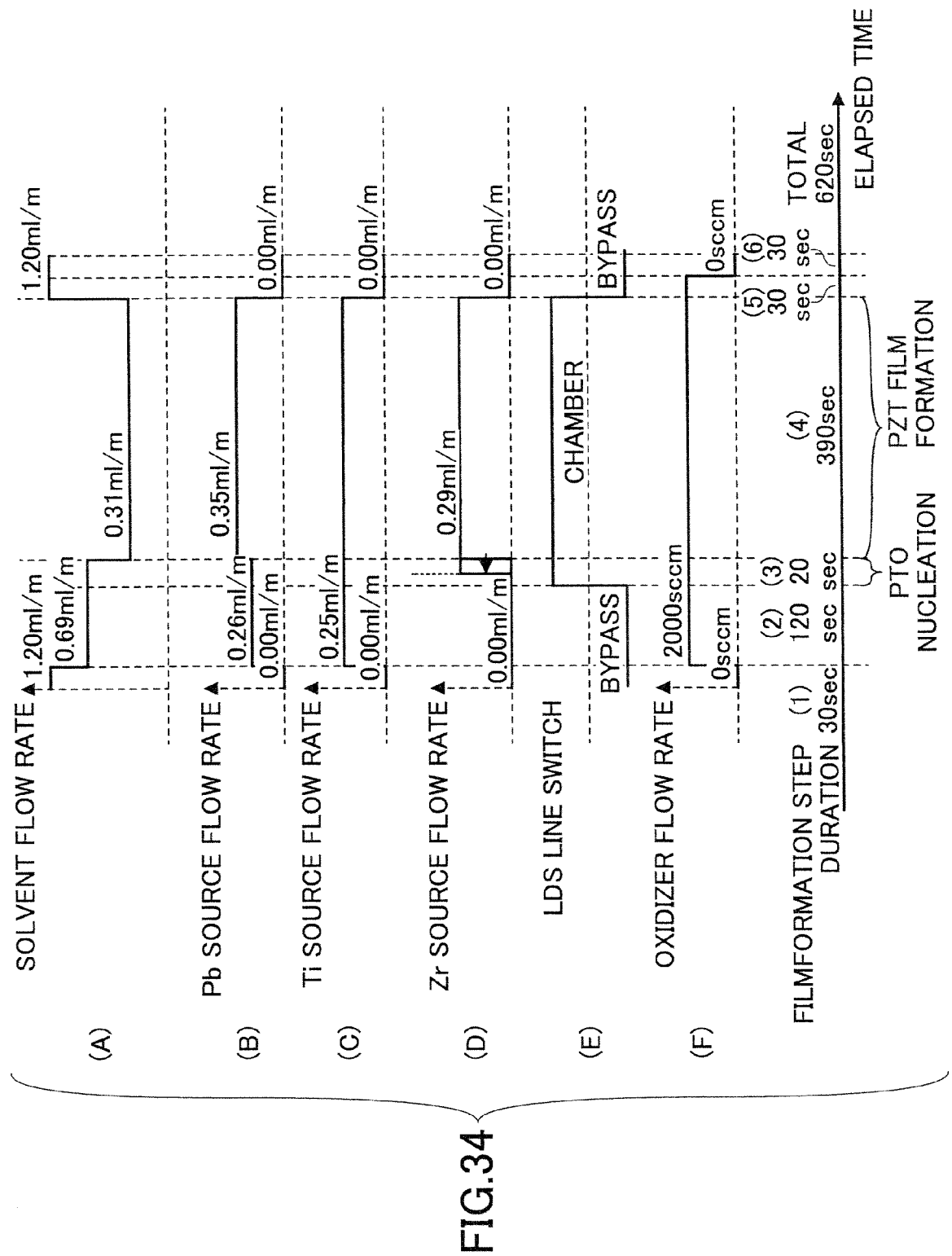
FIG. 34 is a diagram showing an apparatus recipe used with second embodiment of the present invention.

Thus, with the present embodiment, the change of flow rate setting of the liquid mass-flow controller 19C for the Zr liquid metal source material is conducted with a timing in advance of the timing of changing the flow rate setting for other liquid mass-flow controllers 19B and 19D at the time of starting formation of the PZT film 23 after formation of the PTO nucleation layer 22 as shown in the recipe (A)-(F) of FIG. 34.

Referring to FIG. 34, it should be noted that (A) of FIG. 34 represents the flow rate change of the solvent, of which flow rate is controlled by the liquid mass-flow controller 19A, (B) of FIG. 34 represents the flow rate change of the Pb liquid metal organic source, of which flow rate is controlled by the liquid mass-flow controller 19B, (C) of FIG. 34 shows the flow rate change of the Ti liquid metal-organic source, of which flow rate is controlled by liquid mass-flow controller 19D, (D) of FIG. 34 shows the flow rate change of the Zr liquid metal-organic source, of which flow rate is controlled by liquid mass-flow controller 19C, while (E) of FIG. 34 shows the switching of the gaseous metal-organic source formed in the vaporizer 14 between the by-pass line 14C and the shower head 11A of the processing vessel 11 as a result of switching of the valves 14B and 14D. Further, (F) of FIG. 34 shows the flow rate of the oxidation gas introduced into the processing vessel 11 through the line 13.

Further, in (A)-(F) of FIG. 34, it should be noted that "(1)" of the horizontal axis corresponds to the vacuum evacuation process corresponding to the step 1 of FIG. 32, "(2)" corresponds to the preflow process corresponding to the step 2 of FIG. 32, "(3)" corresponds to the PTO nucleation layer formation process corresponding to the step 3 of FIG. 32, "(4)" corresponds to the PZT film formation process corresponding to the step 15 of FIG. 32, "(5)" corresponds to the purge process corresponding to the step 6 of FIG. 32, and "(6)" corresponds to the vacuum evacuation process corresponding to the step 7 of FIG. 32.

Referring to (A) of FIG. 34, the solvent in the tank 17A is supplied to the vaporizer 14 during the vacuum evacuation process (1) by the liquid mass-flow controller 19A with the flow rate of 1.2 ml/minute, while when the supply of the liquid metal-organic sources of Pb and Ti is started with the respective flow rates of 0.26 ml/minute and 0.25 ml/minutes as shown in (B) and (C) of FIG. 34 in the preflow process (2) after the vacuum evacuation process for 30 seconds, the flow rate preset value of the liquid mass-flow controller 19A is decreased by that amount in (A) of FIG. 34, and the solvent flow rate is set to the value of 0.69 ml/minute. Further, at the same time to this, the Valves 13B and 13 C, are opened and the oxidation gas is supplied to the shower head 11A through mass-flow controller 13A with the flow rate of 2000 SCCM. The supply of the oxidizing agent is continued until the purging process (5) is terminated.

The preflow process (2) is continued for 120 seconds in this state, and the valves 14B and 14D, are switched subsequently in the PTO nucleation layer formation process (3). Thereby, the gaseous metal-organic sources of Pb and Ti are introduced into the processing vessel 11 via the shower head 11A as shown in (E) of FIG. 34.

The nuclei formation process is continued for 20 seconds in the illustrated example, and the PTO nucleation layer 22 is formed to the thickness of 8 nm as a result.

Thereafter, together with start of the PZT film formation process (4) corresponding to step 15 of FIG. 32, the liquid mass-flow controllers 19B, 19C and 19D are controlled, and the liquid metal-organic source of Pb is supplied with the flow rate of 0.35 ml/minute as shows in (B) of FIG. 34, the liquid metal-organic source of Ti is supplied with the flow rate of 0.25 ml/minute as shows in (C) of FIG. 34, and the liquid metal-organic source of Zr is supplied with the flow rate of 0.29 ml/minute as shows in (D) of FIG. 34. Further, along with this, the flow rate of the solvent is decreased to 0.31 ml/minute as shown in (A) of FIG. 34 and the total flow rate of the liquids supplied to the vaporizer 14 is maintained at 1.20 ml/minute.

Thereby, as shown in (D) of FIG. 34, the timing of the flow rate setting is set in the flow rate liquid mass-flow controller 19C that supplies the liquid metal-organic source of Zr and tends show delayed because of the small flow rate is advanced by two seconds with regard to other liquid mass flow controllers 19A, 19B and 19D.

Figure 35:
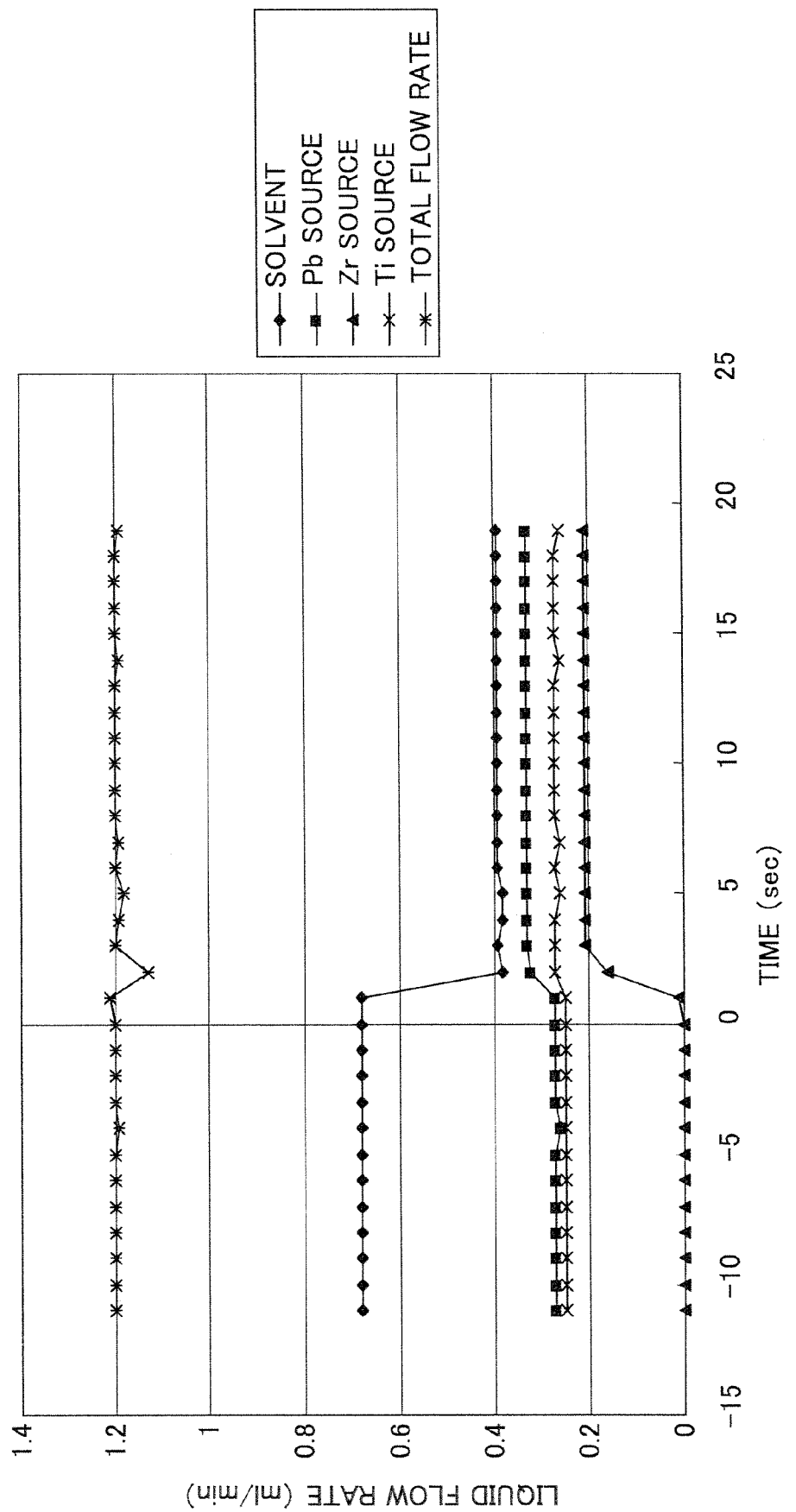
FIG. 35 is a diagram showing the effect of the second embodiment of the present invention.

With this, the gaseous metal-organic sources of Pb, Zr and Ti are introduced from the shower head 11A into the processing vessel 11 substantially simultaneously and mixed therein as shown in FIG. 35, and it becomes possible to suppress the variation of the total flow rate of the liquid source materials supplied in the vaporizer 14 minimum and it becomes possible to suppress the compositional change of the PZT film 23 to be formed minimum.

The PZT film formation process (4) is continued for 390 seconds, for example, and after that, the outlet of the vaporizer 14 is switched to the by-pass line 14C by the valves 14B and 14D in the purging process (5) corresponding to the step 6 of FIG. 32. Further, the supply of the Pb, Ti and Zr is shut down. With this, the interior of the processing vessel 11 is purged by the oxidation gas from the line 13 for the duration of 30 seconds, and thereafter, the supply of the oxidation gas to the processing vessel 11 is shut down in the vacuum evacuation process (6) corresponding to the step 7 of the FIG. 32. Thereby, the interior of the processing vessel 11 is evacuated.

Further, the ferroelectric capacitor 6 that constitutes the ferroelectric memory of FIG. 1 is obtained by forming the upper electrode 24 of $IrO_2$ or the like, on the PZT film 23 thus formed, by way of a sputtering process or the like, in the process (D) of FIG. 4.

While the present invention has been explained heretofore with regard to the preferred embodiments, the present invention is not limited to such specific embodiment and various variations and modifications may be made within the scope described the claims.

For example, it is possible to carry out the formation of the PTO nucleation layer 22 in the process (A) of FIG. 4 at a lower temperature such as 450-550° C. Thereby, it is also possible to carry out the film formation process (B) and (C) of forming the PZT film 23 of FIG. 4 at the same low temperature. The present invention is applicable also to the films such as PLZT, PCZT, PNZT, or the like, in which the PZT is doped with an element such as La, Ca, Nb, or the like. Further, the present invention achieves the PTO nucleation by using TiOx, it is possible to reduce the film formation temperature. Further, the present invention is applicable also to the case of the substrate temperature lower than 600° C., such as 550-600°

C., in some cases 450-550° C. Of course, the present invention is applicable also in the case the substrate temperature is set to 600° C. or higher.

Further, while the foregoing embodiments of the present invention have used the source materials in which Pb(DPM)$_2$, Zr(O-i-Pr)(DPM)$_3$ or Ti(O-i-Pr)$_2$(DPM)$_2$ is dissolved into the butyl acetate as the metal-organic source, the present invention is not limited to such specific source materials, and it is also possible to use other metal-organic sources such as Zr(O-i-Pr)$_2$(DPM)$_2$, Zr(DPM)$_4$, Zr(O-t-Bu)$_4$, Ti(O-i-Pr)$_4$, or the like. Further, it is also possible to use other organic solvent such as octane, hexane, THF (tetrahydrofuran), or the like for the solvent.

Further, while the present embodiment uses Ir for the lower electrode, the present invention is not limited such specific lower electrode and it is also possible to use a metal of platinum group element such as Pt, Ru, or the like, or a conductive oxide such as IrO$_2$, SrRuO$_3$, or the like.

Furthermore the present invention is effective also in the production of electron devices that use a PTO film. Application of such a PTO film is expected in the field of temperature sensors and piezoelectric actuators.

Third Embodiment

Figure 36:
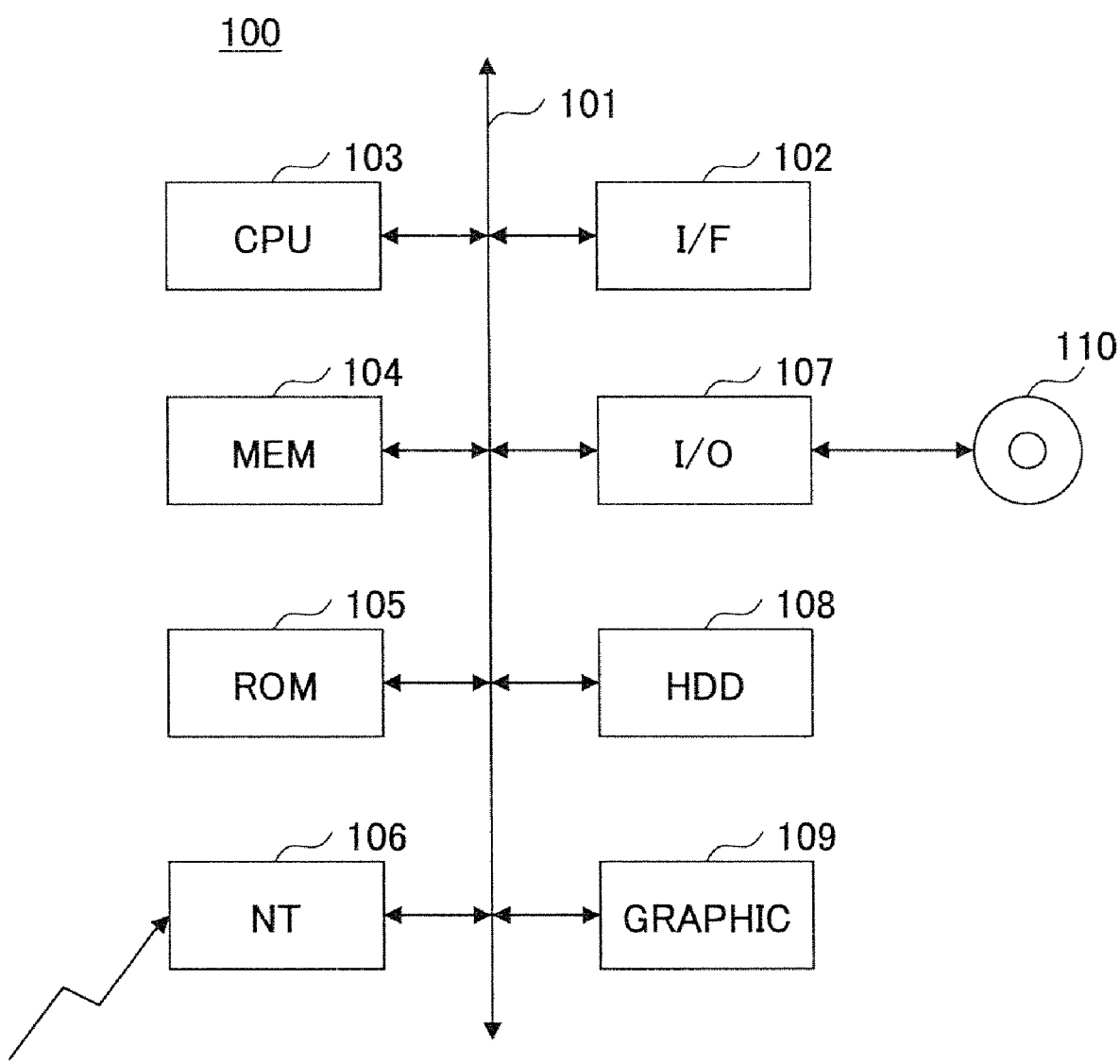
FIG. 36 is a diagram showing the construction of a general-purpose computer according to a third embodiment of the present invention.

FIG. 36 shows the construction of a control unit 100 used to control the MOCVD apparatus 10 of FIG. 2 for executing the film formation process of FIG. 3 or the film formation process of FIG. 32.

Referring to FIG. 36, the control unit 100 is a general-purpose computer having a system bus 101 and includes an interface card 102 connected to the system bus 101 and controls the each part of the MOCVD apparatus 10 of FIG. 2.

More specifically, the system bus 101 is connected with, in addition to the interface card 102, a CPU 103, a memory 104, a ROM 105, a network interface 106, an input-output device 107 such as keyboard and mouse, a hard disk drive 108, a CDROM drive, a graphic card 109, and the like, wherein the input-output device 107 reads out the control program of the MOCVD apparatus 10 from an optical disk or magnetic disk 110 that stores the foregoing control program and stores the same in the hard disk drive 108.

Thus, the CPU 103 reads out the control program from the hard disk 108 according to with a system control program stored in a ROM 105 and expands the same in the memory 104. Further, the CPU 103 executes the program thus expanded in the memory 104 and controls the MOCVD apparatus 10 according to the program of the FIG. 3 or 32 or the recipe of FIG. 5 or 34 via the interface card 102. Further, the CPU 103 displays the information for the operator on a monitor (not shown) according to the needs via the graphic card 109.

In the computer of FIG. 36, the program may also be the one provided from a network via the network interface 106.

While the present invention has been explained with reference to the preferred embodiments, the present invention is by no means limited to such specific embodiments and various variations and modifications may be made without the scope described in claims.

The present invention is based on the Japanese priority application 2005-176060 filed on Jun. 16, 2005, the entire contents of which are hereby incorporated as reference.

INDUSTRIAL APPLICABILITY

According to the present invention, it, become possible to conduct the formation process of a nucleation layer at a low temperature of 450-550° C. by forming a PTO film on the lower electrode as the nucleation layer of the PZT film, and it becomes possible to suppress the diffusion of impurity elements in the active region at the time of the thermal annealing process associated with the formation process of the ferroelectric film. Thereby, by conducting the nucleation layer formation process under the oxygen partial pressure of less than 340 Pa, preferably 249 Pa or less, more preferably 163 Pa or less, or by conducting the nucleation layer formation process under the oxygen flow rate of less than 2000 SCCM, preferably 1000 SCCM or less, more preferably 500 SCCM or less, or by forming the PTO nucleation layer the film thickness exceeding 2 nm, preferably 5 nm, or preferably 8 nm or more, it becomes possible to form the PTO nucleation layer such that the PTO nucleation as a whole has a (111) orientation. With this, the PZT film formed on the PTO nucleation layer shows also the predominantly (111) orientation, and the PZT film shows excellent ferroelectricity in the case an electric field is applied in a vertical direction to the film surface. Further, the present invention is applicable also when the film formation temperature is 550-600° C. or higher.

While the PZT film thus formed on the PTO nucleation layer of the (111) orientation under such a oxygen partial pressure shows the tendency of increased crystal grain size when the PTO film is formed with increased film thickness, the surface thereof is flat and a PZT film suitable for forming the ferroelectric capacitor by forming the upper electrode thereon is obtained.

Also the degree of (111) orientation of the PTO nucleation layer can be increased by conducting the formation process of the nucleation layer under the total pressure of 1000 Pa or less.

Further, by suppressing the Pb/Ti ratio of Pb and Ti in the PTO film to be less than 1.09, preferably 1.05 or less, abnormal growth of the PbOx crystal on the PTO film is suppressed and formation of the PZT film is facilitated.

The invention claimed is:

1. A method for fabricating a semiconductor device, characterized by the steps of:
    forming a PbTiOx film having a predominantly (111) orientation on a lower electrode as a nucleation layer by an MOCVD process with a film thickness exceeding 2 nm; and
    forming a PZT film having a predominantly (111) orientation on said nucleation layer,
    wherein said step of forming said PbTiOx film is conducted under an oxygen partial pressure of less than 340 Pa.

2. The method for fabricating a semiconductor device as claimed in claim 1, characterized in that said step of forming said PbTiOx film is conducted such that said PbTiOx film has a film thickness exceeding 5 nm.

3. The method for fabricating a semiconductor device as claimed in claim 1, characterized in that said step of forming said PbTiOx film is conducted such that said PbTiOx film has a film thickness exceeding 8 nm.

4. The method for fabricating a semiconductor device as claimed in claim 1, characterized in that said step of forming said PbTiOx film is conducted under an oxygen flow rate of less than 2000 SCCM.

5. The method for fabricating a semiconductor device as claimed in claim 1, characterized in that said step for forming said PbTiOx film is conducted under an oxygen partial pressure of 249 Pa or less.

6. The method for fabricating a semiconductor device as claimed in claim 5, characterized in that said step of forming said PbTiOx is conducted under an oxygen flow rate of 1000 SCCM or less.

7. The method for fabricating a semiconductor device as claimed in claim 1, characterized in that said step of forming said PbTiOx film is conducted under an oxygen partial pressure of 163 Pa or less.

8. The method for fabricating a semiconductor device as claimed in claim 7, characterized in that said step of forming said PbTiOx film is conducted under an oxygen flow rate of 500 SCCM or less.

9. The method for fabricating a semiconductor device as claimed in claim 1, characterized in that said step of forming said PbTiOx film is conducted under a total pressure of 1000 Pa or less.

10. The method for fabricating a semiconductor device as claimed in claim 1, characterized in that said step of forming said PbTiOx film is conducted by supplying Pb(DPM)2 as a metal organic source of Pb and Ti(o-i-Pr)2(DPM)2 as a metal organic source of Ti.

11. The method for fabricating a semiconductor device as claimed in claim 1, characterized in that said PbTiOx film has a Pb/Ti compositional ratio of less than 1.09 in said film.

12. The method for fabricating a semiconductor device as claimed in claim 1, characterized in that said lower electrode comprises an Ir electrode film.

13. The method for fabricating a semiconductor device as claimed in claim 1, characterized in that said step of forming said PbTiOx film comprises a first step of supplying a liquid metal organic source of Pb and a liquid metal organic source of Ti on said lower electrode by causing vaporization in a vaporizer together with a solvent, said step of forming said PZT comprises a second step of supplying a liquid metal organic source of Pb, a liquid metal organic source of Ti and a liquid metal organic source of Zr on said nucleation layer by causing vaporization in said vaporizer together with said solvent, wherein a total flow rate of said liquid metal organic source of Pb, said liquid metal organic source of Ti and said solvent supplied to said vaporizer in said first step is set equal to a total flow rate of said respective liquid metal organic sources of Pb, Ti and Zr and said solvent supplied to said vaporizer in said second step.

14. The method for fabricating a semiconductor device as claimed in claim 13, characterized in that said second step is conducted immediately after said first step.

15. The method for fabricating a semiconductor device as claimed in claim 13, characterized in that said respective liquid metal organic sources of Pb, Ti and Zr are supplied in said first and second steps to said vaporizer via respective liquid mass flow controllers, wherein a flow rate setting of one of said liquid mass flow controllers used to supply one of said liquid metal organic sources of the smallest flow rate is changed in advance of a flow rate setting of the other liquid mass flow controllers used to supply the other liquid metal organic sources.

16. The method for fabricating a semiconductor device as claimed in claim 15, characterized in that said liquid metal organic source of the smallest flow rate is a metal organic source of Zr, and wherein a flow rate setting of said liquid mass flow meter used to supply said liquid metal organic source of Zr is changed in advance of two seconds with regard to said liquid mass flow controllers used to supply the other said liquid metal organic sources.

* * * * *